United States Patent
Oka

(10) Patent No.: US 7,545,837 B2
(45) Date of Patent: Jun. 9, 2009

(54) ONE-DIMENSIONAL ILLUMINATION APPARATUS AND IMAGING APPARATUS

(75) Inventor: Michio Oka, Tokyo (JP)

(73) Assignee: Sony Corporation, Tokyo (JP)

( * ) Notice: Subject to any disclaimer, the term of this patent is extended or adjusted under 35 U.S.C. 154(b) by 653 days.

(21) Appl. No.: 11/109,912

(22) Filed: Apr. 19, 2005

(65) Prior Publication Data
US 2005/0238071 A1   Oct. 27, 2005

(30) Foreign Application Priority Data

| Apr. 22, 2004 | (JP) | ............................. 2004-127181 |
| Sep. 1, 2004 | (JP) | ............................. 2004-254425 |
| Mar. 25, 2005 | (JP) | ............................. 2005-088819 |

(51) Int. Cl.
  *H01S 3/10* (2006.01)
(52) U.S. Cl. .......................................... 372/22; 372/21
(58) Field of Classification Search .............. 372/21–22
See application file for complete search history.

(56) References Cited

U.S. PATENT DOCUMENTS

| 5,197,072 A | * | 3/1993 | Harada et al. ................. 372/21 |
| 5,247,528 A | * | 9/1993 | Shinozaki et al. ............. 372/22 |
| 5,521,932 A | | 5/1996 | Marshall |
| 5,959,765 A | * | 9/1999 | Nakamura et al. .......... 359/326 |
| 5,978,392 A | * | 11/1999 | Adachi ........................ 372/21 |
| 7,403,549 B2 | * | 7/2008 | Koyata et al. ................ 372/21 |

| 2003/0035448 A1 | * | 2/2003 | Yin .............................. 372/22 |
| 2005/0190805 A1 | * | 9/2005 | Scripsick et al. .............. 372/41 |

FOREIGN PATENT DOCUMENTS

JP   2001-185792   6/2001

* cited by examiner

*Primary Examiner*—Minsun Harvey
*Assistant Examiner*—Phillip Nguyen
(74) *Attorney, Agent, or Firm*—Robert J. Depke; Rockey, Depke & Lyons, LLC

(57) ABSTRACT

A one-dimensional transverse multiple mode laser is used for a one-dimensional illumination apparatus. A pumping light source, and a laser medium and a wavelength conversion device (nonlinear optical crystal or a nonlinear optical device) which are disposed in a resonator, are provided, and the nonlinear optical crystal or a nonlinear optical device is irradiated with a line beam obtained by exciting the laser medium in an elliptic transverse mode pattern. Then, a one-dimensional light modulation device is irradiated with the wavelength-converted line beam, and scanning with the beam modulated by the modulation device is conducted to produce a two-dimensional image. For example, in a green illumination optical system, in the case where the nonlinear optical device for obtaining visible rays through second harmonic generation from IR rays oscillated by a solid state laser medium has a periodical poling structure, stoichiometric composition periodical poling lithium tantalate having been subjected to vapor transport equilibration is used, whereby reliability is enhanced and a reduction in cost can be achieved through mass production.

15 Claims, 21 Drawing Sheets

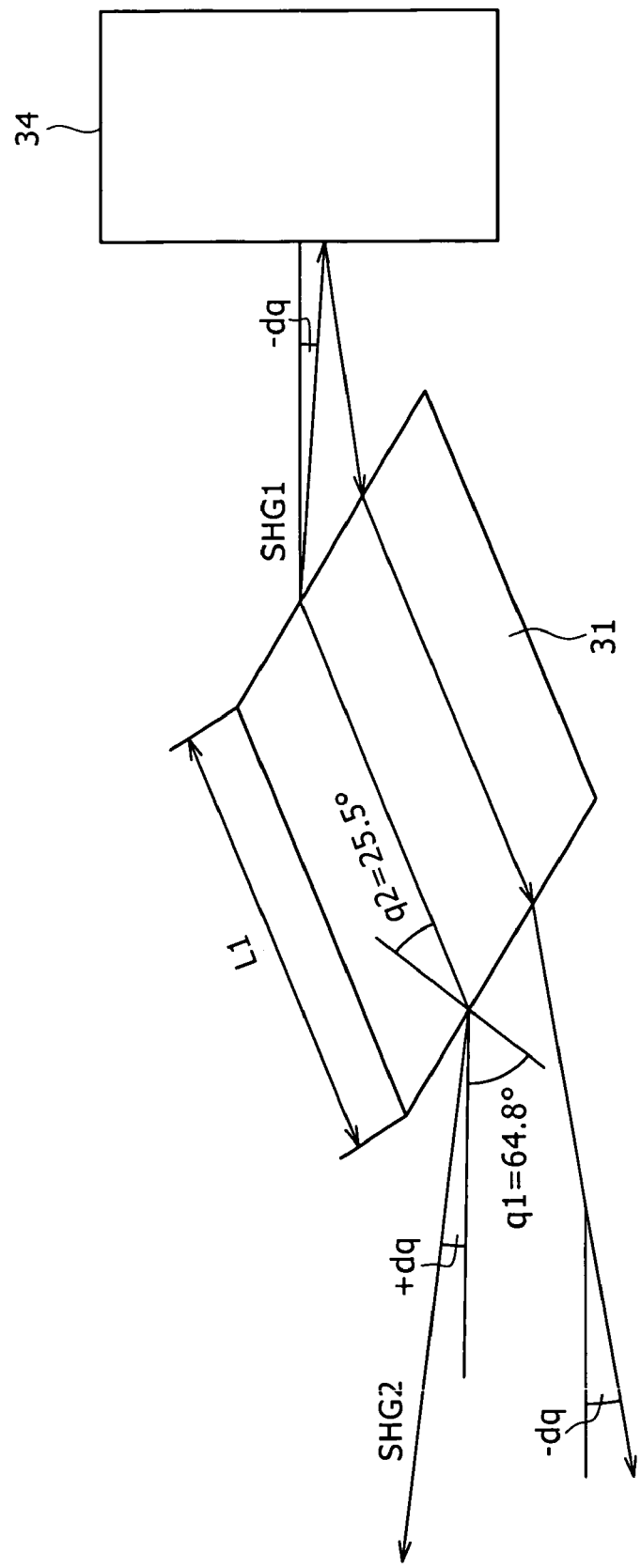

ONE-DIMENSIONAL ILLUMINATION APPARATUS AND IMAGING APPARATUS

This application claims priority of Japanese Patent Application No. JP2004-127181, filed Apr. 22, 2004; Japanese Patent Application No. JP2004-254425, filed on Sep. 1, 2004 and Japanese Patent Application No. JP2005-088819, filed on Mar. 25, 2005 which are all incorporated herein by reference.

BACKGROUND OF THE INVENTION

The present invention relates to a technology for contriving higher output and higher efficiency and enhancing image quality and the like in a one-dimensional illumination apparatus and an imaging apparatus which use a one-dimensional transverse multiple mode laser.

Solid state lasers are used in the cases where a high output is desirable. In the cases of using a semiconductor laser as a pumping light source, there have been known, for example, a form in which a laser array having a plurality of emitters (radiation sources) and an optical device (micro-lens array) are combined (see, for example, Japanese Patent Laid-open No. 2001-185792), and a form in which a diode array and a collimation cylindrical lens are combined (see, for example, U.S. Pat. No. 5,521,932).

In addition, nonlinear optical crystals are used for wavelength conversion and the like. For example, in the case of second harmonic generation (SHG), green light can be obtained by incidence of near IR external light. In the case of an optical waveguide circuit type device, a device having a periodical poling structure along the direction of an optical waveguide circuit has been known, which can be mass-produced at a lower cost by the wafer process technology.

In application to imaging apparatuses (projectors, printers, etc.) using a laser light source and a light modulation device, a configuration in which an image display light modulation device having a one-dimensional spatial modulation type structure has been known for enhancing the resolution of image. For example, in application to image projectors, by providing a light modulation device for modulating the light from a laser light source and projecting an image onto a screen by light scanning of the flux from the light modulation device, it is possible to project a two-dimensional image.

However, the configurations according to the related art have problems as to the output and efficiency of the laser light source and the like.

For example, in application to image projectors and the like, it is desirable to use a green laser apparatus with an output of about 5 W, but it is difficult to actually produce a high-output high-efficiency laser, or the use of an expensive apparatus leads to such problems as a rise in cost. In addition, in order to form a line beam with which to irradiate a one-dimensional light modulation device from a spot-like laser light, it is desirable to use a profile conversion optical system, a line generator or the like, which causes complication of configuration. Besides, it may be necessary to perform an optical adjustment (alignment) with high accuracy, or the number of portions to be adjusted may be increased, resulting in an influence on stability or the like problems.

In addition, a measure to reduce the speckle noise arising from the high coherence of a laser light may be required in application to laser displays or the like.

Besides, where non-uniformity in beam intensity of one-dimensional oscillation is observed, irregularities in intensity may be generated at the time of illumination. Therefore, where transverse pumping of a laser medium is performed in the configuration of a solid state laser, uniformity of the pumping light in the transverse direction may matter.

SUMMARY OF THE INVENTION

From the foregoing, it is desirable to provide a one-dimensional illumination apparatus and an imaging apparatus which are high in output and efficiency and are effective for reducing the speckle noises.

According to an embodiment of the present invention, there is provided a one-dimensional illumination apparatus using a one-dimensional transverse multiple mode laser. The apparatus includes a pumping light source, and a laser medium and a wavelength conversion device which are provided in a resonator. Nonlinear optical crystal or a nonlinear optical device constituting the wavelength conversion device is irradiated with a line beam obtained by exciting the laser medium in an elliptical transverse mode pattern to thereby output a line ray.

According to another embodiment of the present invention, there is provided an imaging apparatus including a light source using a one-dimensional transverse multiple mode laser, a one-dimensional light modulation device modulating the light from the light source, and light scanning means scanning the output light for producing am image. Nonlinear optical crystal or a nonlinear optical device constituting the wavelength conversion device is irradiated with a line beam obtained by exciting the laser medium in an elliptic transverse mode pattern, to output a wavelength-converted line ray, and a one-dimensional light modulation device is irradiated with the wavelength-converted line ray.

In the present invention, therefore, one-dimensional illumination with high output and high efficiency can be realized by utilizing an elliptical transverse mode pattern. In addition, the lowering of coherence by pumping in transverse multiple mode is effective for reducing the speckle noises. Besides, since nonlinear optical crystal or the nonlinear optical device is disposed in the resonator, the oscillation light confined in the inside of the resonator is high in power density, so that wavelength conversion at high efficiency can be achieved, and continuous oscillation can be realized.

According to the present invention, it is possible to obtain a line beam with a higher output and a higher efficiency as compared with a single transverse mode laser, without such troubles as complication of apparatus configuration, which is advantageous for reducing cost. In application of the present invention to an imaging apparatus using a one-dimensional light modulation device, it is unnecessary to positively taking a measure to reduce speckle noises by use of an optical device or the like, and it is possible to realize simplification of constitution, a reduction in size and the like.

In the form in which the pumping light from the pumping light source for transverse pumping of the laser medium is condensed by a condensing optical system, it is desirable to dispose the focus position on or in the vicinity of an end face on the opposite side of an end face for incidence of the laser medium. This makes it possible to realize a uniform and efficient one-dimensional line oscillation and to realize a high-efficiency illumination system with little irregularities of illumination. In addition, since concentration of the pumping light on the incidence side of the laser medium can be prevented, it is possible to reduce the thermal lens effect generated at the laser medium and the thermal birefringence effect, which contributes to enhancement of output, enhancement of efficiency, and the like.

In relation to an pumping system using a semiconductor laser as the pumping light source, the adoption of a form in which an end face along the laser output axis of the laser medium is irradiated with the pumping light (end face pumping system, or so-called end pump) is effective for enhancing the efficiency. Besides, the adoption of a form in which the laser medium is irradiated with the pumping light from a lateral side orthogonal to the laser output axis by use of a semiconductor laser (side surface pumping system, or so-called side pump) is effective not only for enhancing the output but also for simplifying the configuration, reducing the number of component parts, and coping with the heat removal problem.

The use of a parallel-connected light source (laser array) obtained by arranging a plurality of laser emitters in a one-dimensional pattern makes it possible to realize a higher output, and the use of a lens array disposed between the parallel-connected light source and the laser medium makes it possible to excite the laser medium at a high efficiency.

Besides, in the form of directly exciting the laser medium by use of such a parallel-connected light source, the number of component parts can be reduced, which contributes to a reduction in the number of working steps through elimination of the need for optical alignment. This promises a lowered cost, and is effective on a quality control basis. In this case, it is preferable to provide the laser medium with light confining means and to confine the pumping light, thereby enhancing the efficiency.

As for produceability and processability of the laser medium, the sectional area of the laser medium is set rectangular (rectangular parallelopiped, or the like), whereby it is possible to achieve such a control as to obtain a desired transverse mode pattern according the shape design.

As for the nonlinear optical device disposed in the resonator, use of an optical device having a periodical poling structure makes it possible to obtain a higher nonlinear optical constant and a higher conversion efficiency than those of past nonlinear optical crystals. In addition, the nonlinear optical device can be mass-produced by the wafer process technology, which is preferable for reduction in cost. Particularly, where a stoichiometric composition periodical poling lithium tantalate subjected to vapor transport equilibration is used, a device resistant to optical damaging and excellent in long-term reliability can be obtained, and the wavelength conversion efficiency is high, so that high-output light can be obtained stably. In addition, the length of the line beam from the laser medium can be coped with by enlarging the transverse width (the width in the direction orthogonal to both the thickness direction and the optical axis direction) of the device, which is effective as a measure for enhancing the output. Specifically, it suffices that the resistance electric field is about 100 V/mm, the substrate thickness is not less than 0.9 mm, and the poling period is set to be not less than 10 µm (micrometers) for phase matching related to harmonic generation (it is possible to secure a sufficient aperture for a beam spot size of 100 µm, and to enhance processability in Brewster polishing).

For reducing the resonator size, it is preferable to dispose optical path turn-back reflecting means between the laser medium and nonlinear optical crystal or the nonlinear optical device, whereby stable output light can be obtained.

In a form in which a green or blue line beam is outputted by second harmonic generation using nonlinear optical crystal or the nonlinear optical device, disposing a rare earth-added solid state laser medium in an IR resonator makes it possible to obtain visible light (line ray) based on the high-output IR light from the solid state laser medium.

In addition, shortening the coherence length (or coherent length) to a value of not less than 2 mm and not more than 20 mm is effective for reducing interference noises, for reducing the optical system in size, and the like; for example, where Nd:YAG is used as the laser medium, it is preferable to set the coherence length to a value of not less than 2.2 mm and not more than 15 mm.

In order to minimize the loss of the fundamental wave and harmonics at end faces of the nonlinear optical device, it is preferable for both end faces to be so processed as to have roughly a Brewster's angle with respect to the incidence angle and outgoing angle of the fundamental light; in this case, there is adopted a configuration in which a reflector is provided at a position spaced from the nonlinear optical device. Of the harmonic rays in two directions generated by d33 phase matching, one harmonic ray is reflected by the reflector after outgoing from the nonlinear optical device and outgoes from an end face on the opposite side of the nonlinear optical device after being again incident on the nonlinear optical device, whereas the other harmonic ray outgoes from the side of an end face located on the opposite side of the reflector. Where a configuration is adopted in which an angular difference is provided between both the harmonic rays so that the harmonic rays are not superposed on each other, it is possible to eliminate the need for phase control.

In the application of the present invention to an imaging apparatus in which the light from a one-dimensional illumination light source using a one-dimensional transverse multiple mode laser is modulated by a one-dimensional light modulation device and a two-dimensional image is formed by light scanning, matching of the one-dimensional direction (major axis direction) concerning the modulation device and the direction of the transverse multiple mode eliminates the need for profile conversion and makes it possible to reduce the number of component parts and the number of locations of optical adjustment. Besides, it is possible to irradiate a diffraction grating type one-dimensional light modulation device (or one-dimensional spatial modulation device) with a line illumination ray required in the case of using the device (i.e., light spreading over the effective length of the device and sufficiently condensed in the minor axis direction (transverse width direction) of the device), which is effective for enhancing the performance, for enhancing the image quality, and the like.

BRIEF DESCRIPTION OF THE DRAWINGS

These and other objects of the invention will be seen by reference to the description, taken in connection with the accompanying drawings, in which:

FIG. 22 is a side view showing a major part of another form of the resonator according to an embodiment of the present invention.

DETAILED DESCRIPTION OF THE PREFERRED EMBODIMENTS

The present invention relates to a one-dimensional illumination apparatus and an imaging apparatus which use a one-dimensional transverse multiple mode laser, and can be applied, for example, image display apparatuses (image projectors, etc.), image output apparatuses such as plotters, printers, etc., various working or processing apparatuses, and the like which use light modulation devices.

Figure 1:
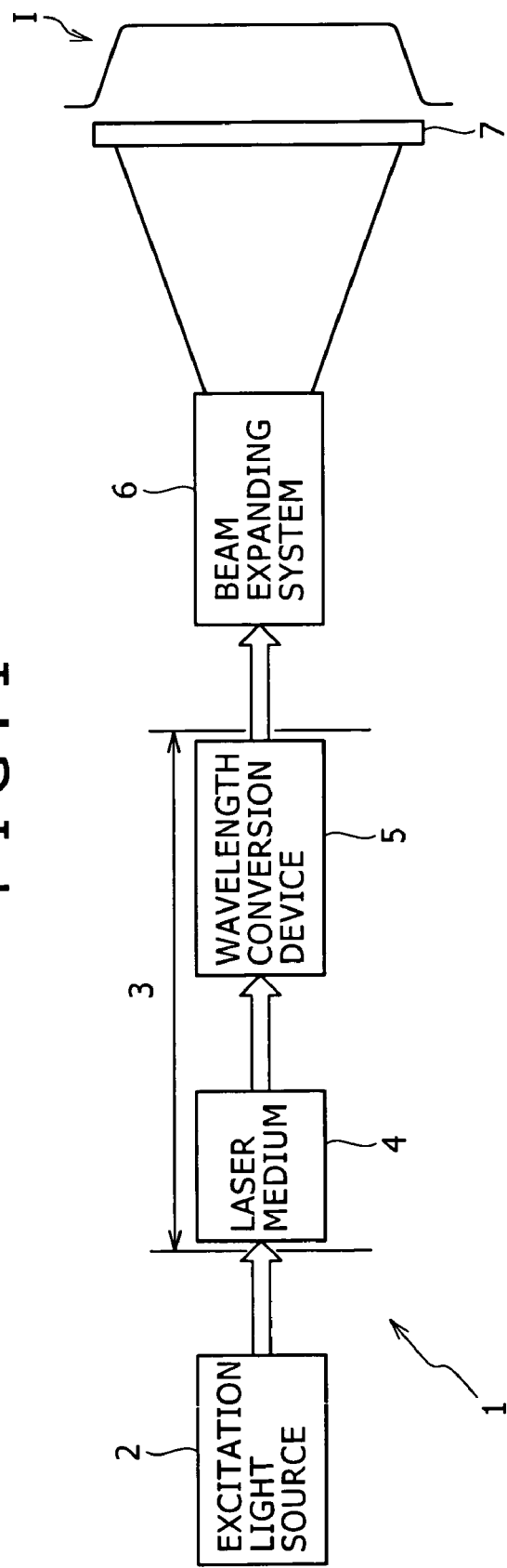
FIG. 1 illustrates an exemplary configuration of a one-dimensional illumination apparatus according to an embodiment of the present invention.
Figure 2:
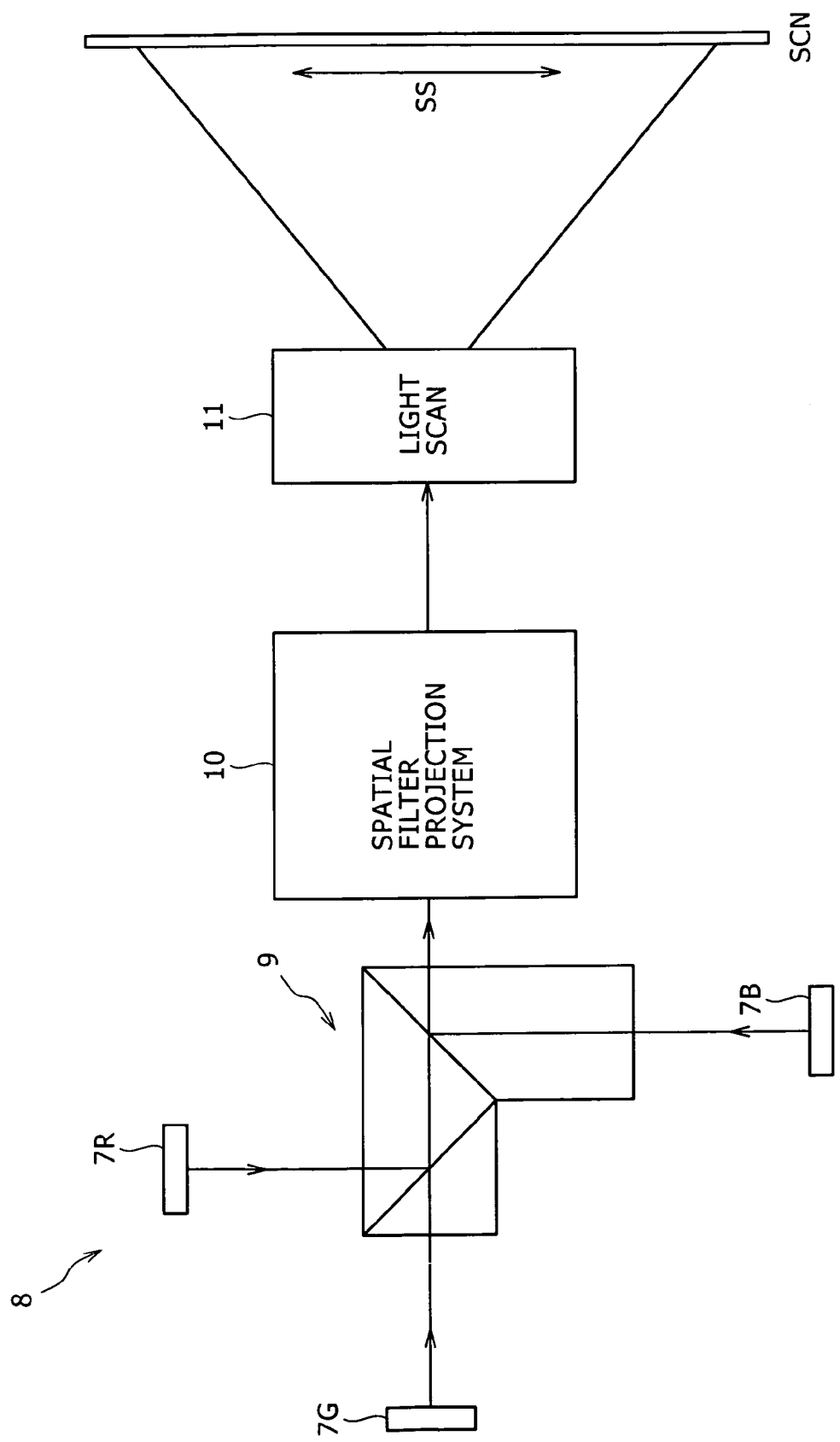
FIG. 2 illustrates a major part of an exemplary configuration of an imaging apparatus according to another embodiment of the present invention.

FIGS. 1 and 2 show an example of fundamental configuration according to an embodiment of the present invention.

FIG. 1 shows an exemplary configuration of a one-dimensional illumination apparatus concerning a one-dimensional light modulation device.

A laser light source constituting the one-dimensional illumination apparatus 1 is a one-dimensional transverse multiple mode laser, and includes a pumping light source 2, and a laser medium 4 and a wavelength conversion device 5 which are provided in a resonator 3.

A laser, a discharge lamp and the like may be used as the pumping light source 2, and a semiconductor laser is preferable in the case of taking a smaller size, useful life or the like into consideration (it is possible to entirely compose the pumping light source by use of solid state lasers).

As the laser medium 4, there may be used a rare earth-added solid state laser material, examples of which include Nd:YAG, Nd:YVO$_4$, Nd:GdVO$_4$, and Yb:YAG.

Nonlinear optical crystal or a nonlinear optical device constituting the wavelength conversion device 5 may be used for wavelength conversion such as, for example, SHG or THG (third harmonic generation), or may be used for sum frequency generation, light parametric oscillation or the like. Examples of the material for nonlinear optical crystal or the nonlinear optical device include nonlinear optical materials (for example, those having a periodical poling structure by periodical poling control through application of a voltage or the like) such as KTiOPO$_4$, β-BaB$_2$O$_4$, LiBe$_3$O$_5$, MgO:LiNbO$_3$, PP-KTiOP0$_4$, PP-MgO:LiNbO$_3$, PP-MgO:S-LiNbO$_3$, PP-S-LiTaO$_3$, etc. Here, "PP" means "Periodical Poling", and "S" means "Stoichiometric".

By disposing in the resonator the wavelength conversion section 5 using nonlinear optical crystal or the nonlinear optical device, it is ensured that the oscillation light confined in the inside of the resonator 3 is high in power density, and it is possible to achieve wavelength conversion at a high efficiency. In addition, while pulse oscillation might be required if nonlinear optical crystal or the nonlinear optical device is disposed outside the resonator 3, the arrangement of nonlinear optical crystal or the nonlinear optical device in the inside of the resonator 3 makes it possible to achieve continuous oscillation.

The laser medium 4 is irradiated with the pumping light outputted from the pumping light source 2, and the laser medium 4 is excited in an elliptical transverse mode pattern. nonlinear optical crystal or The nonlinear optical device is irradiated with a line beam obtained in this manner, and a wavelength-converted line ray is outputted from the resonator 3.

A beam expanding system 6 is an optical system disposed at a stage next to the resonator 3, and is provided for obtaining a line illumination beam expanded in the longitudinal direction (major axis direction) of a one-dimensional light modulation device 7. Illumination of the one-dimensional light modulation device 7 is conducted with an intensity distribution denoted by "I" in the figure (the distribution is in a so-called top hat shape in which the intensity is flat over a certain range and is steeply lowered in the skirt area).

The one-dimensional light modulation device 7 is controlled through reception of a signal from a drive circuit (not shown), to modulate the light on the basis of a picture signal.

In application of the present invention, the one-dimensional light modulation device is not particularly limited; for example, a grating light valve developed by Silicon Light Machine (SLM) of the United States can be used. This device is configured by use of a reflection type diffraction grating, wherein a multiplicity of movable ribbons are arranged at a predetermined interval, and fixed ribbons are arranged respectively between the adjacent movable ribbons. With a drive voltage impressed between a common electrode and the movable ribbons, the movable ribbons are moved, whereby a diffraction grating for incident light is configured. In other words, primary diffracted light is generated in this condition (at the so-called pixel-ON time), whereas the primary diffracted light is not generated (only normal reflection of the incident light is present) in the condition where the movable ribbons are not moved (at the so-called pixel-OFF time). With the configuration in which specified diffracted light is utilized, this system can be used for display of an image or the like with a high diffraction efficiency (for example, a blaze type device is preferable for display of a high-gradation image).

In the above configuration, for example, in a form in which a near IR laser is used as the pumping light source 2 and the laser medium 4 and the wavelength conversion device 5 (SHG device) are disposed in an IR resonator, illumination of the one-dimensional light modulation device 7 through the beam expanding system 6 can be performed by outputting a green or blue line beam through second harmonic generation.

For forming the line beam, for example, a method in which a spot obtained by a laser diode or the like is converted into a line form by a line generator (lens) may be used, but this method may need a high positional accuracy. On the other hand, when a configuration in which the transversely long line beam is used from the light pumping stage is adopted, optical devices are unnecessitated, the number of component parts is reduced, and optical alignment is facilitated.

Incidentally, while FIG. 1 shows a configuration in which an object to be illuminated (in this example, the one-dimensional light modulation device 7) is irradiated with a line illumination ray by use of the beam expanding system 6, there can be carried out various forms according to the use, for example, a form in which the object of illumination is irradiated with a line ray without using the above-mentioned optical system.

FIG. 2 schematically shows an exemplary configuration of a major part (exclusive of the one-dimensional illumination light source using the one-dimensional transverse multiple mode laser) of an imaging apparatus 8, and shows an example of application to a projection system.

One-dimensional light modulation devices 7R, 7G, 7B are provided in respective correspondence of the three primary colors of R (red), G (green), and B (blue), to constitute light modulation sections for modulating colored illumination rays. The rays modulated by the one-dimensional light modulation devices are mixed by a composing section 9 such as an L prism, and the resultant ray is projected onto a screen SCN through an optical system 10 and a light scanning section 11 on the latter stage.

The optical system 10 includes a spatial filter, a projection system and the like, and the ray modulated by the one-dimensional light modulation device is passed through, for example, a schlieren filter for selecting a primary diffracted ray.

The light scanning section 11 is for scanning the output light from the light modulation section in a predetermined direction (see arrow "SS" in the figure), a rotary reflector is used therefor, and the reflected ray is radiated toward the screen SCN disposed on the forward side. Incidentally, examples of light scanning include various forms using a galvano mirror, a polygon mirror or the like.

A one-dimensional image projected on the screen SCN is projected while being developed into a two-dimensional image by the light scanning.

This example is not limitative; there can be carried out various forms as to modifications of the optical elements, for example, a form in which the relationship between the light scanning system and the projection system are reversed, and the projection system is disposed between the light scanning section 11 and the screen SCN.

Now, a specific configuration of the one-dimensional illumination apparatus will be described below.

Examples of light pumping include the following forms.

(A) A form in which an end portion in the direction along the laser output axis of the laser medium is irradiated with the pumping light (so-called end pump)

(B) A form in which the laser medium is irradiated with the pumping light from a side surface portion parallel to the laser output axis (so-called side pump)

First, form (A) will be described.

Examples of the pumping light source include a form in which pumping in an elliptical transverse mode pattern is conducted by use of a broad area LD (laser diode) having a large light emission region width. In this case, a single LD or a plurality of LDs are used. Further, there may be adopted a form in which light pumping is carried out by use of a parallel-connected light source such as a bar laser and a micro-lens array.

Figure 3:
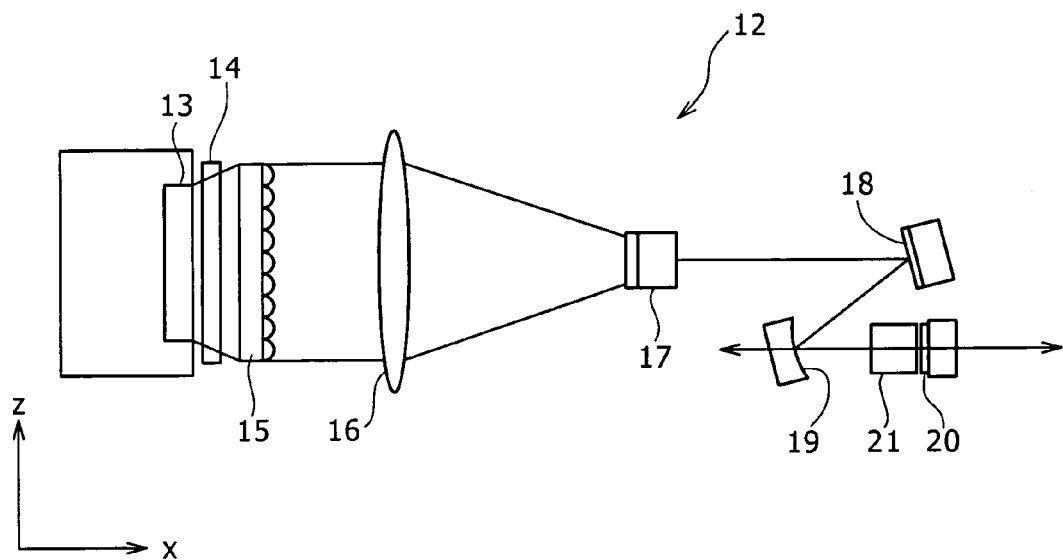
FIG. 3 is a view exemplifying, together with FIG. 4, the one-dimensional illumination apparatus according to an embodiment of the present invention, showing the configuration as viewed from a direction orthogonal to the plane containing the arrangement direction of emitters constituting a parallel-connected light source.
Figure 4:
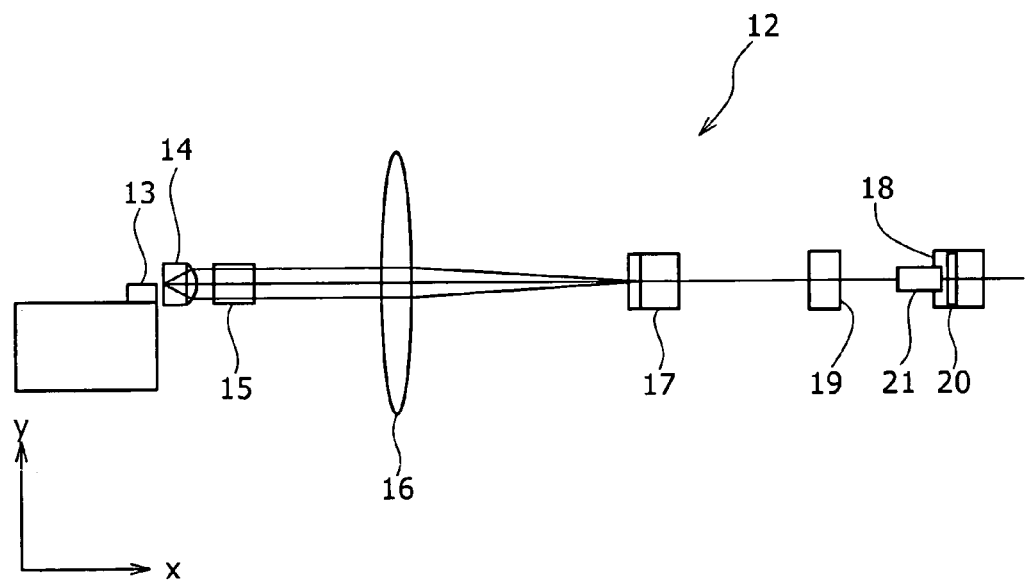
FIG. 4 is a view showing a major part of the configuration as viewed from a direction different from that of FIG. 3.

FIGS. 3 and 4 shows an exemplary configuration 12 in which a laser medium (YVO or the like) is irradiated with pumping light by use of a semiconductor laser (bar laser), a collimating lens using micro-lenses, a condensing lens, and the like.

FIG. 3 shows the configuration as viewed from the y-axis direction orthogonal to the x-axis and the z-axis of a rectangular coordinate system set on the paper surface, while FIG. 4 shows the configuration as viewed from the z-axis direction orthogonal to the x-axis and the y-axis of a rectangular coordinate system set on the paper surface, in which the x-axis is set along the optical axis.

Figure 5:
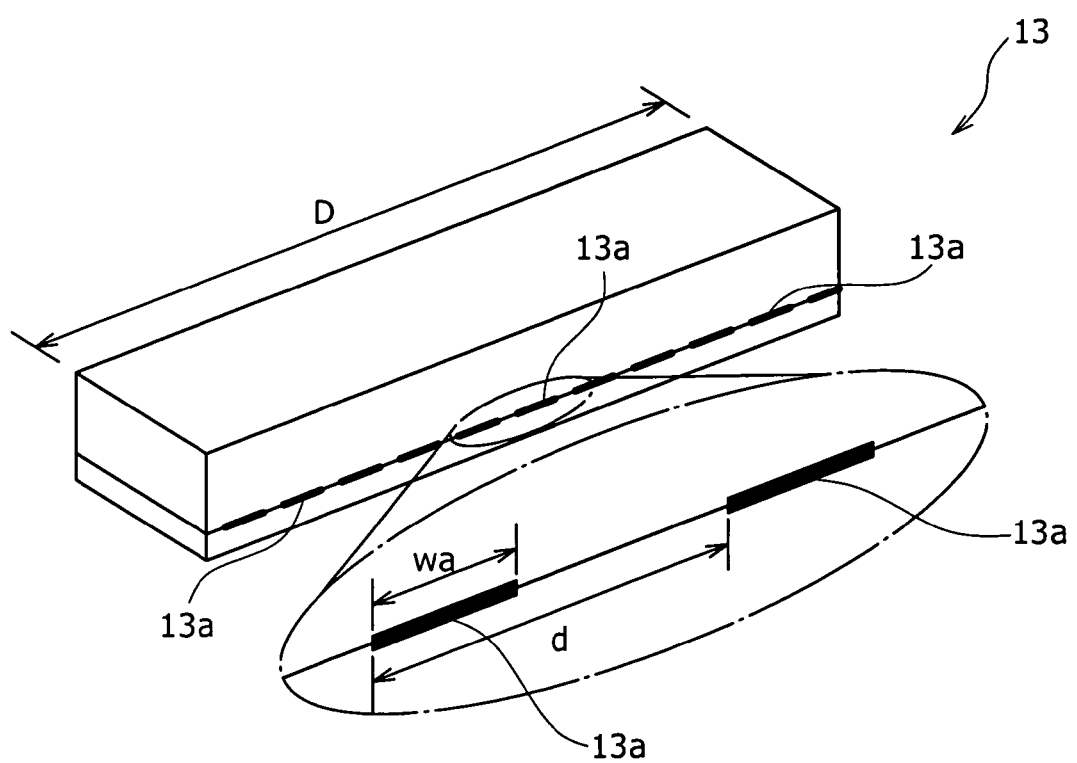
FIG. 5 is a perspective view exemplifying a laser diode array as a parallel-connected light source.

As a parallel-connected light source 13 constituting the pumping light source, a semiconductor laser is used. In an example shown in FIG. 5 (one-dimensional LD array), it has an array structure in which a plurality of laser emitters are arrayed in a one-dimensional pattern. For example, use of laser diodes having a quantum well structure of GaAlAs (gallium-aluminum-arsenic) gives a wavelength of 808 nm (nanometers) and an output of about 40 W, in which stripe form emitters 13a, 13a . . . with an aperture width "wa" are formed at a predetermined interval (see "d" in the figure) along a pn junction plane, and thus the output light of substantially elliptical transverse mode pattern is obtained from the emitters. Incidentally, the size "D" in the longitudinal direction of the light source part is about 10 mm.

Parallel connection of a multiplicity of emitters can realize a higher output, and it is desirable to use emitters having a broad area structure in which the light emission region width of several tens to several hundreds of micrometers.

As shown in FIGS. 3 and 4, the output rays from the emitters constituting the semiconductor laser array are converted into parallel rays by two collimator lenses 14, 15. For example, a lens unit produced by LIMO of Germany can be used. The lens unit is composed by a combination of cylindrical lenses for collimating the divergence in each of directions of "Fast Axis" and "Slow Axis", in which one "Fast Axis Collimator" (FAC) is a non-spherical cylindrical lens, and the other "Slow Axis Collimator" (SAC) is a spherical cylindrical lens array matched to the emitter array pitch and the divergence angle of the laser array. The collimator lens 14 nearer to the semiconductor laser array is "FAC", and the other collimator lens 15 is "SAC"; the output rays from the emitters are condensed and made parallel in the x-y plane in FIG. 4 by the collimator lens 14, and the output rays from the emitters are condensed and made parallel in the x-z plane in FIG. 3 by the micro-lenses of the collimator lens 15. Incidentally, the scattering angle of the laser diodes is greater in the x-y plane than in the x-z plane; in this case, since separate cylindrical lenses are used for the planes, a desired beam profile can be obtained by independently controlling the outgoing beam diameters. In addition, when astigmatism matters in the case where the light emission region of the laser diode is large, it is desirable to use the above-mentioned cylindrical lenses for correction of the astigmatism.

The rays passed through the collimator lenses 14, 15 are converged by a condensing lens 16 on the latter stage, to be a line beam with which one end of a laser medium (YVO crystal or the like) 17 is irradiated.

Nonlinear optical crystal (or a nonlinear optical device) 21 for wavelength conversion by SHG or the like is provided in a resonator configured by use of an end face (reflection surface) of the laser medium 17 or a mirror or reflection section (18, 19, 20) annexed thereto.

The mirrors 18 (plane mirror) and 19 (concave mirror) disposed on the optical path between the laser medium 17 and the nonlinear optical crystal 21 are provided as reflection sections for turning back the optical path. In this embodiment, the output light from the laser medium 17 goes along the x-axis direction to reach the mirror 18, and the light reflected by the mirror 18 goes toward the mirror 19, whereby the optical path is changed. Then, the reflected light from the mirror 19 is transmitted through the nonlinear optical crystal 21 and reaches the mirror 20, to be reflected.

By the turning back of the optical path by use of the reflection sections (18, 19), the apparatus size can be reduced as compared with a system in which a rectilinear optical path is set.

In the case of the SHG device using nonlinear optical crystal, the mirrors 18, 19, 20 are made to exhibit a high reflectance for the wavelength of the output light (fundamental light) from the laser medium 17 and a high transmittance for the wavelength of the second harmonic. Rays pertaining to the effective output and the backward output (which is monitored by use of a light detector such as a photo-diode and the output of the pumping light source is controlled by a control circuit not shown) outgo from the mirrors 19, 20 in opposite directions along the x-axis. The end face of the laser medium 17 or the mirror annexed thereto is made to exhibit a high reflectance for the output light (fundamental light) wavelength and a high transmittance for the incident light wavelength (pumping light wavelength).

In the mirrors 18, 19 for turning back the optical path, the reflectance for the second harmonic (SHG light) is minimized, whereby stray light can be reduced.

In this manner, a high efficiency is obtained due to the pumping light by use of the laser diode (this owes to the matching between the pumping light wavelength and the wavelength of the absorption line of the solid state laser crystal). In addition, the adoption of the end pump is effective for enhancing the efficiency (this owes to the spatial matching between the laser oscillation light and the pumping light).

Where the parallel-connected light source configured by arraying a plurality of laser emitters in a one-dimensional pattern is used, pumping at high efficiency can be achieved by spatially matching the optical axis of each lens to each emitter by use of the lens array disposed between the parallel-connected light source and the laser medium (particularly, in the case of the one-dimensional transverse multiple mode, the matching of the shape of the beam pattern of the laser diode to the laser oscillation light is effective for enhancing the efficiency).

Now, form (B) will be described below.

The adoption of the side pump is effective for reducing the number of component parts and reducing the cost through simplification of configuration, and promises a smaller number of optical adjustment locations. Examples of the adoption of the side pump include the following forms.

Figure 6:
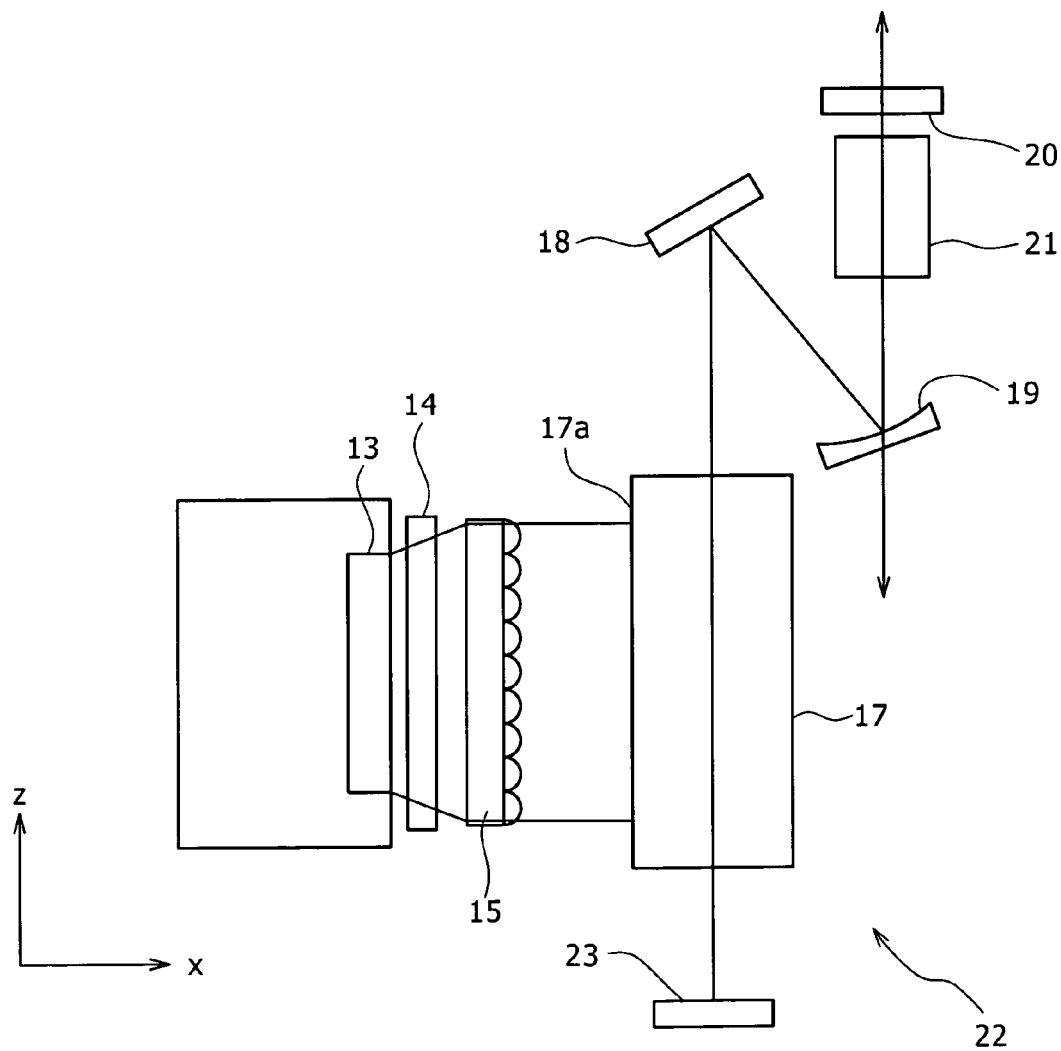
FIG. 6 is a view showing, together with FIG. 7, another example of the one-dimensional illumination apparatus according to an embodiment of the present invention, showing the configuration as viewed from a direction orthogonal to the plane containing the arrangement direction of the emitters constituting the parallel-connected light source.
Figure 7:
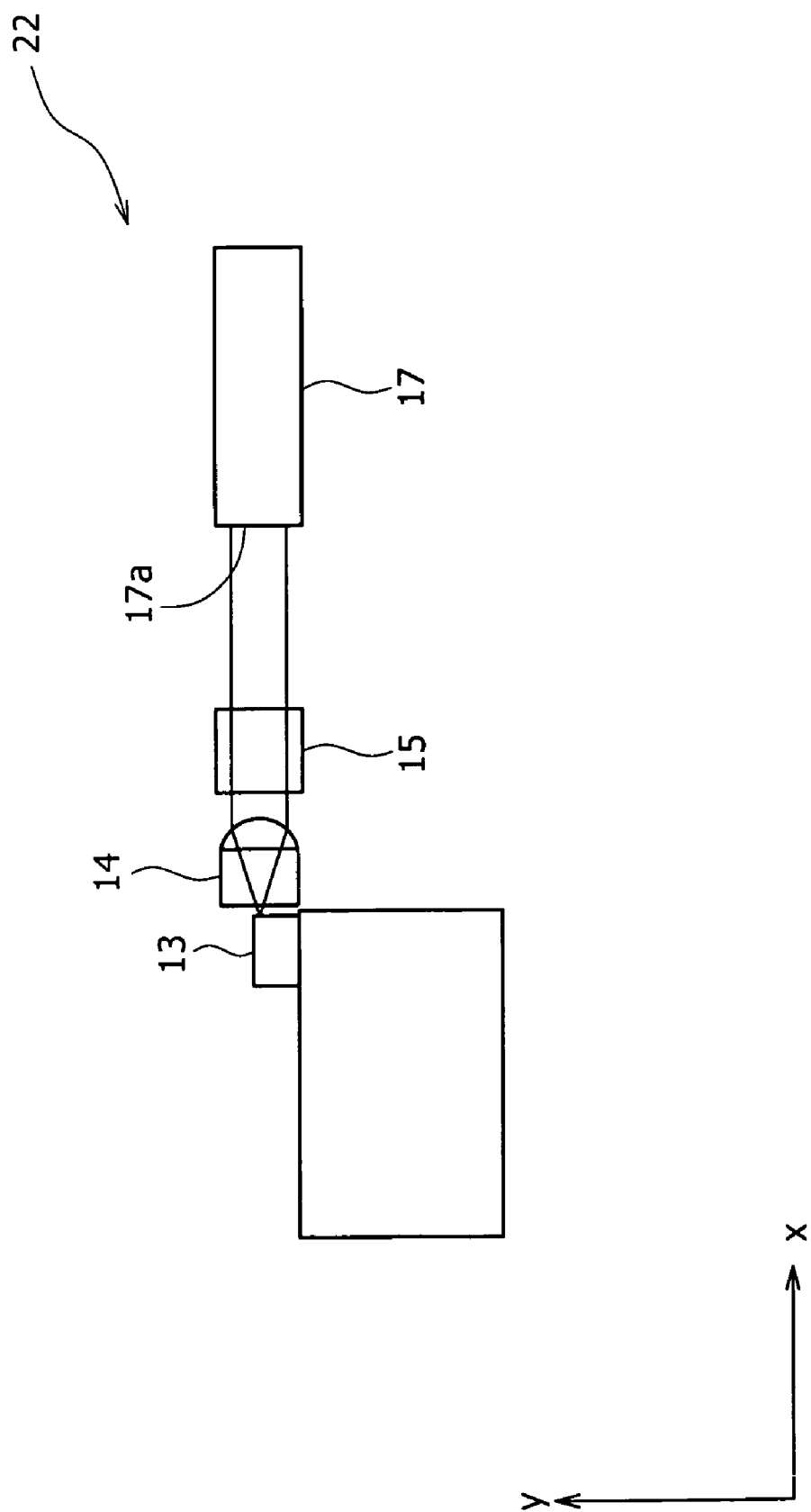
FIG. 7 is a view showing a major part of the configuration as viewed from a direction different from that of FIG. 6.

(B-1) A form in which a parallel-connected light source and two collimator lenses are used (see FIGS. 6 and 7)

(B-2) A form in which a parallel-connected light source and one optical system are used (see FIGS. 8 to 14)

Figure 8:
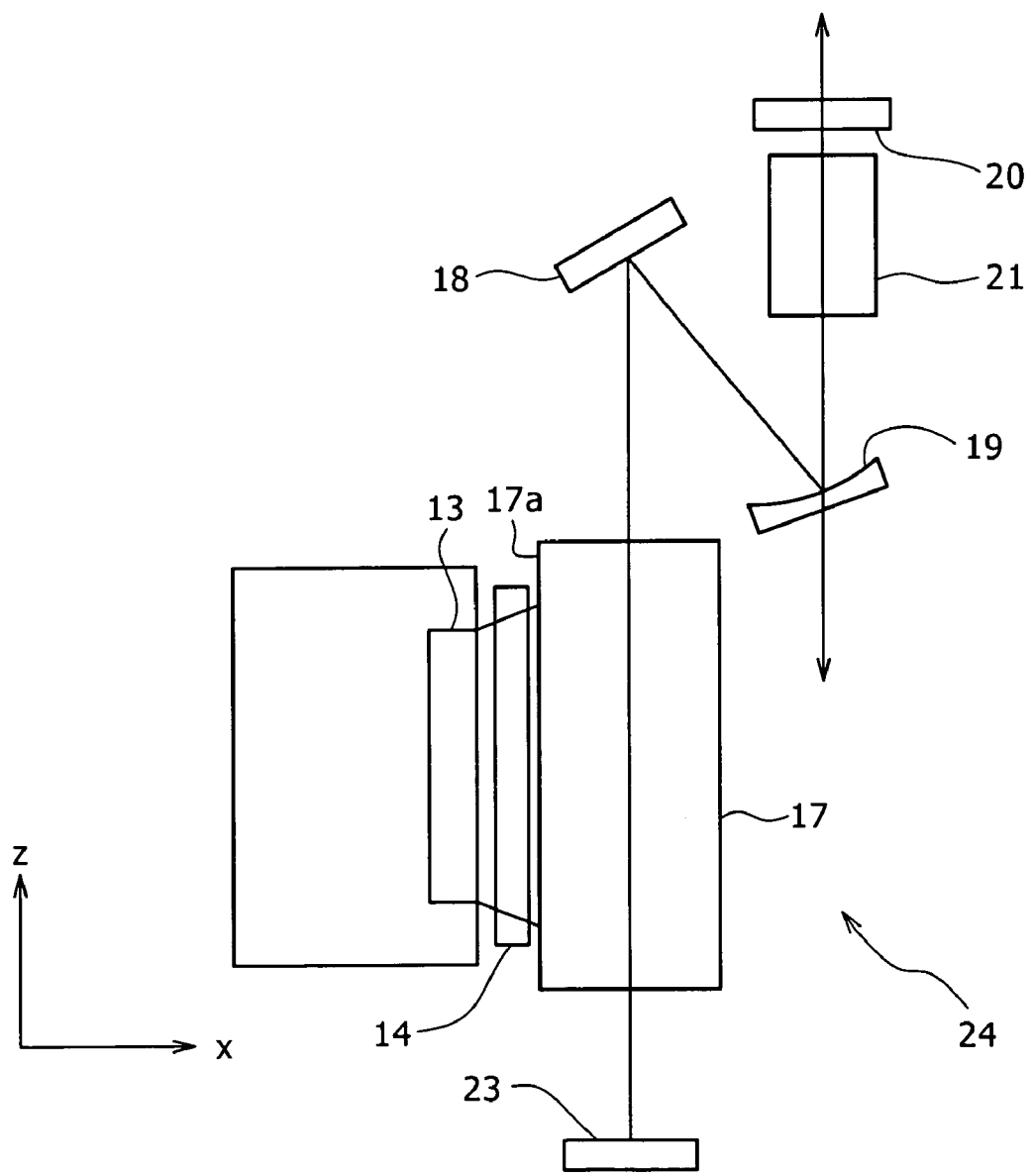
FIG. 8 is a view showing, together with FIG. 9, a further example of the one-dimensional illumination apparatus according to an embodiment of the present invention, showing the configuration as viewed from a direction orthogonal to the plane containing the arrangement direction of the emitters constituting the parallel-connected light source.
Figure 9:
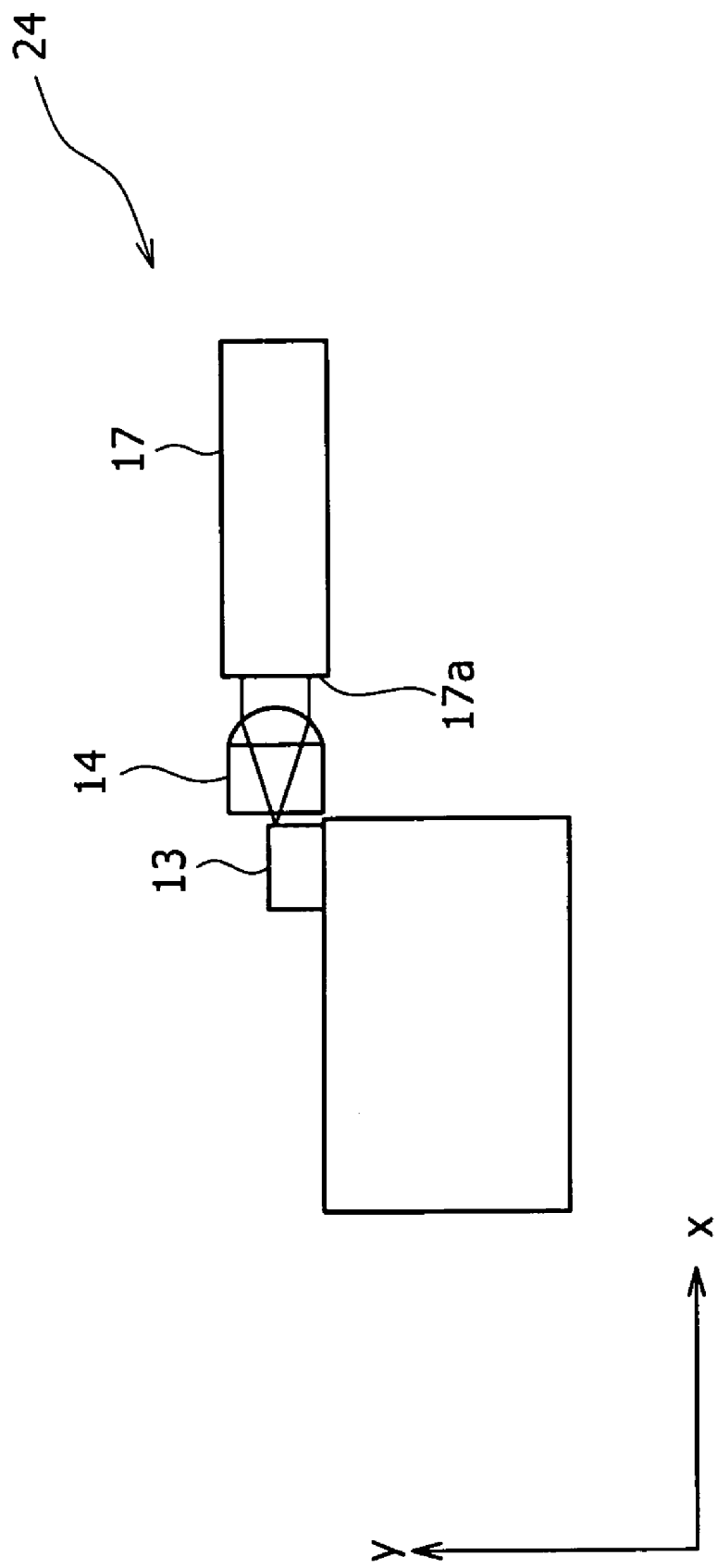
FIG. 9 is a view showing a major part of the configuration as viewed from a direction different from that of FIG. 8.
Figure 13:
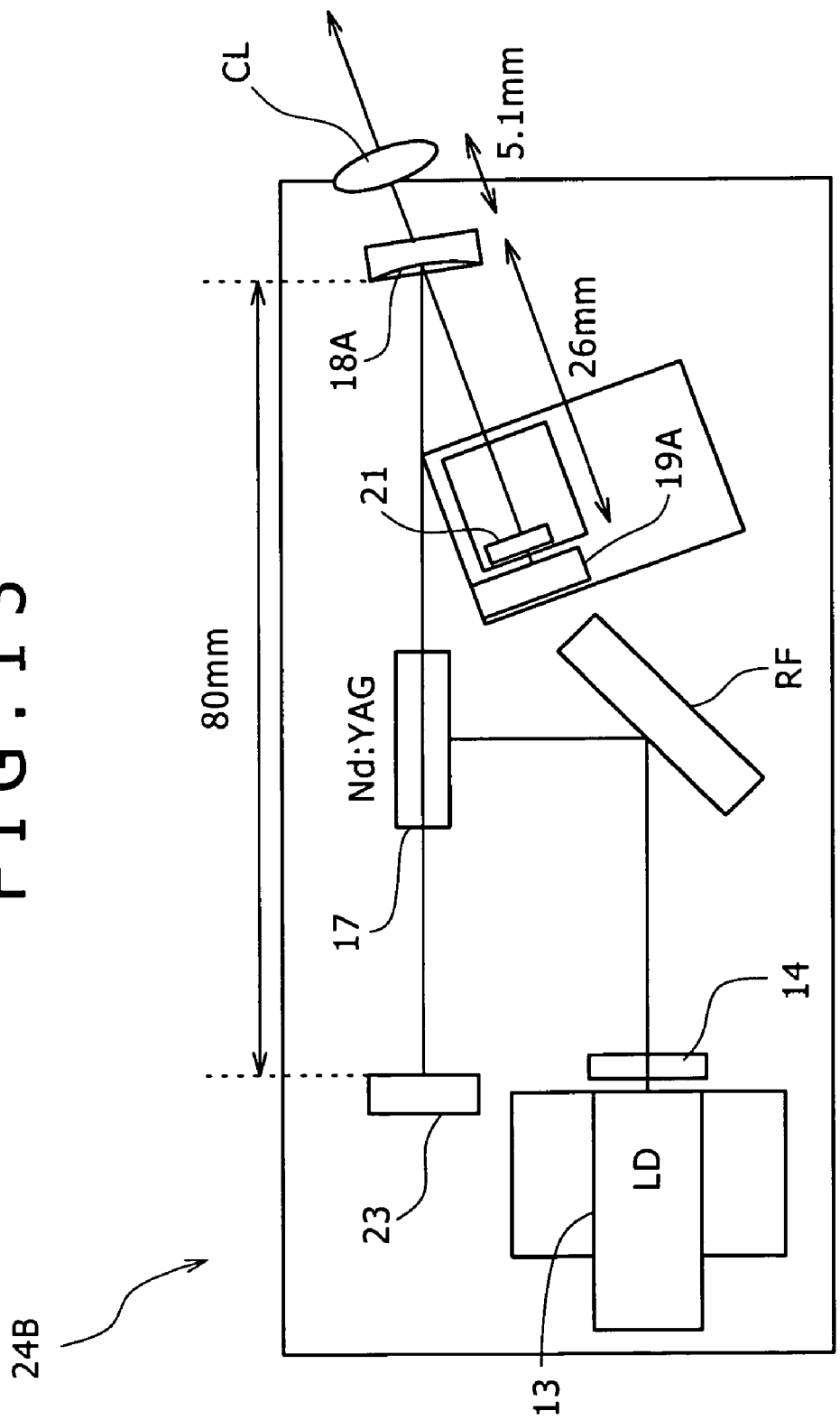
FIG. 13 is a view showing a specific exemplary configuration of the apparatus.

(B-2-1) A form in which a collimator lens is used for the optical system (see FIGS. 8, 9 and 13)

Figure 10:
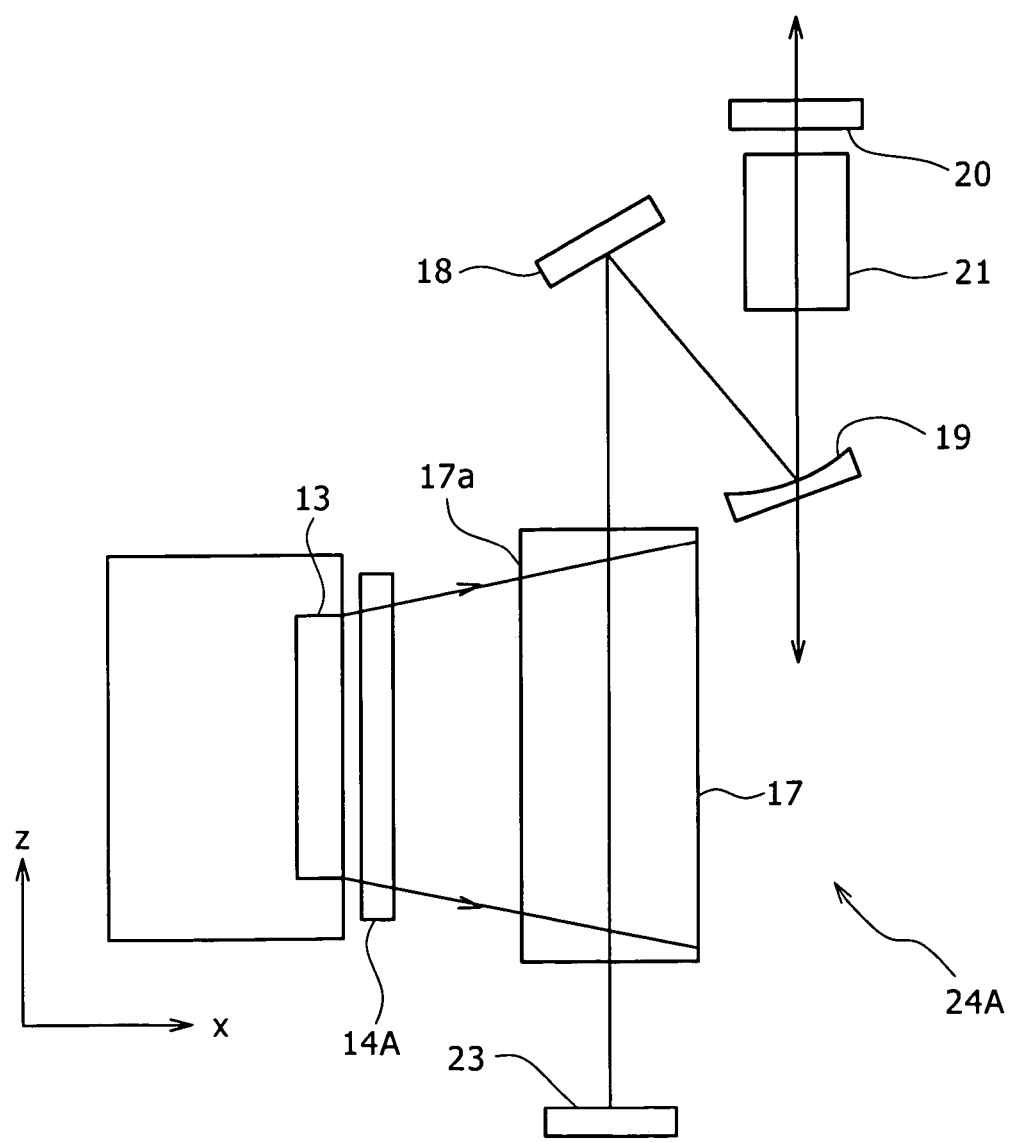
FIG. 10 is a view showing, together with FIG. 11, yet another example of the one-dimensional illumination apparatus according to an embodiment of the present invention, showing the configuration as viewed from a direction orthogonal to the plane containing the arrangement direction of the emitters constituting the parallel-connected light source.
Figure 11:
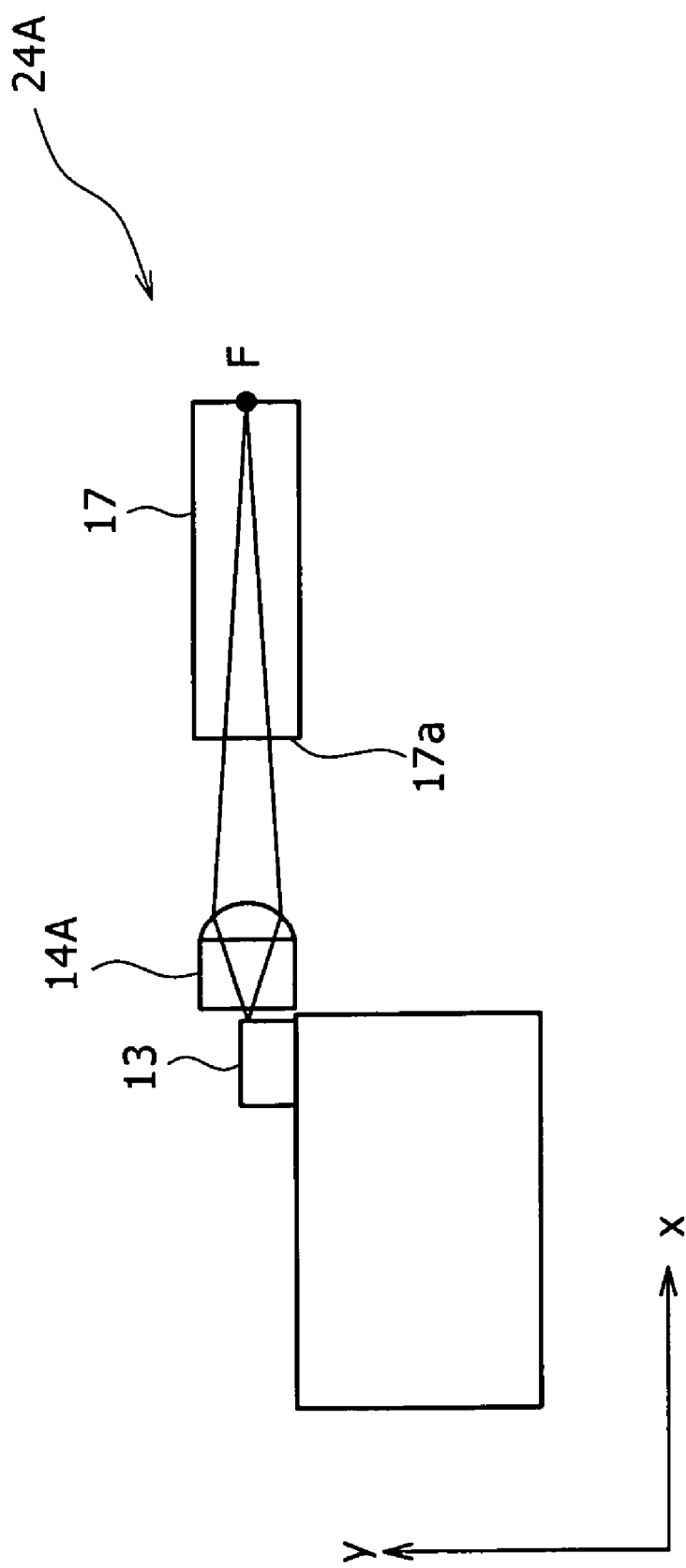
FIG. 11 is a view showing a major part of the configuration as viewed from a direction different from that of FIG. 10.
Figure 14:
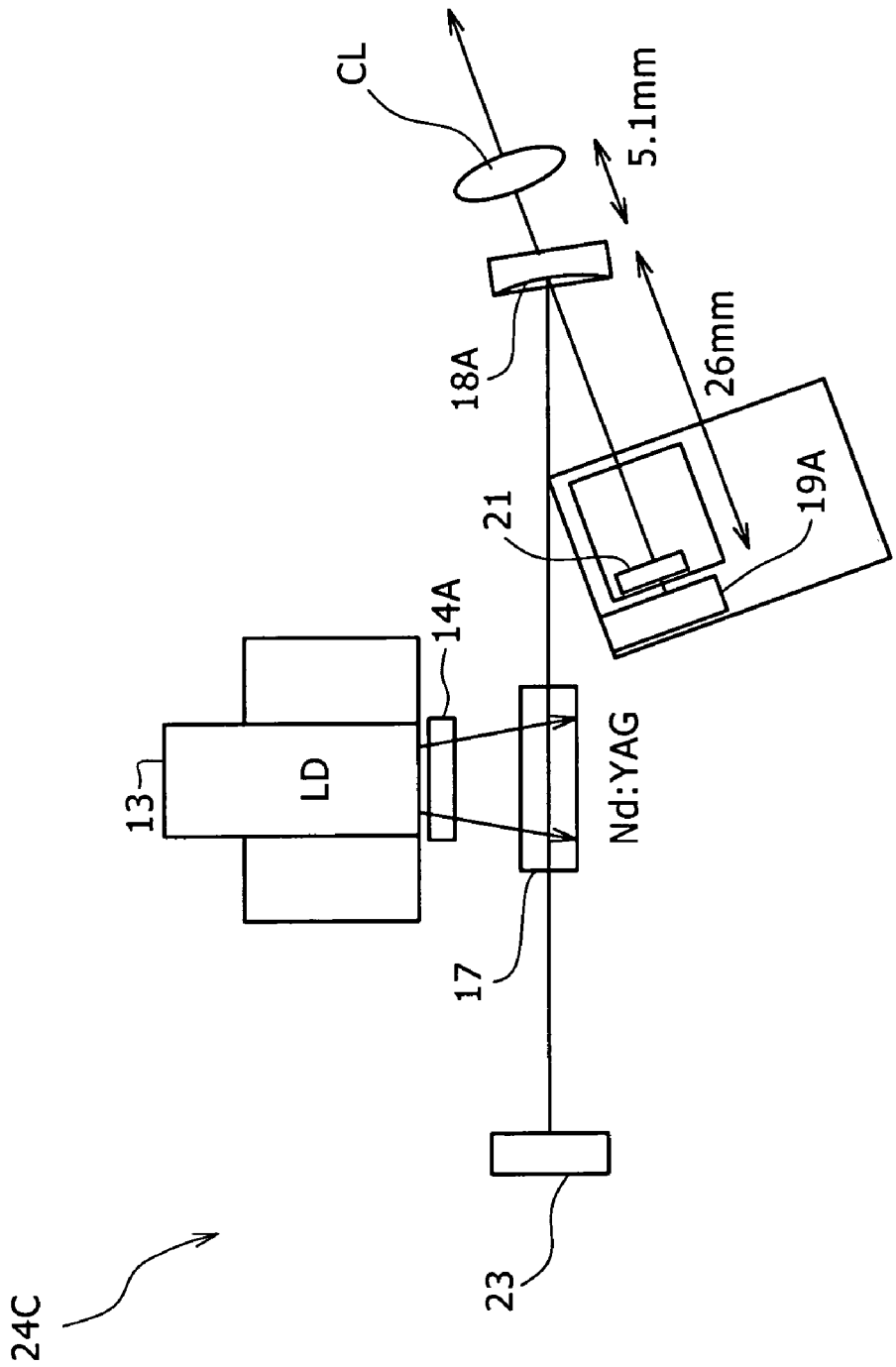
FIG. 14 is a view showing an exemplary apparatus configuration different from FIG. 13.

(B-2-2) A form in which a condensing optical system is used as the optical system (see FIGS. 10, 11 and 14)

Figure 15:
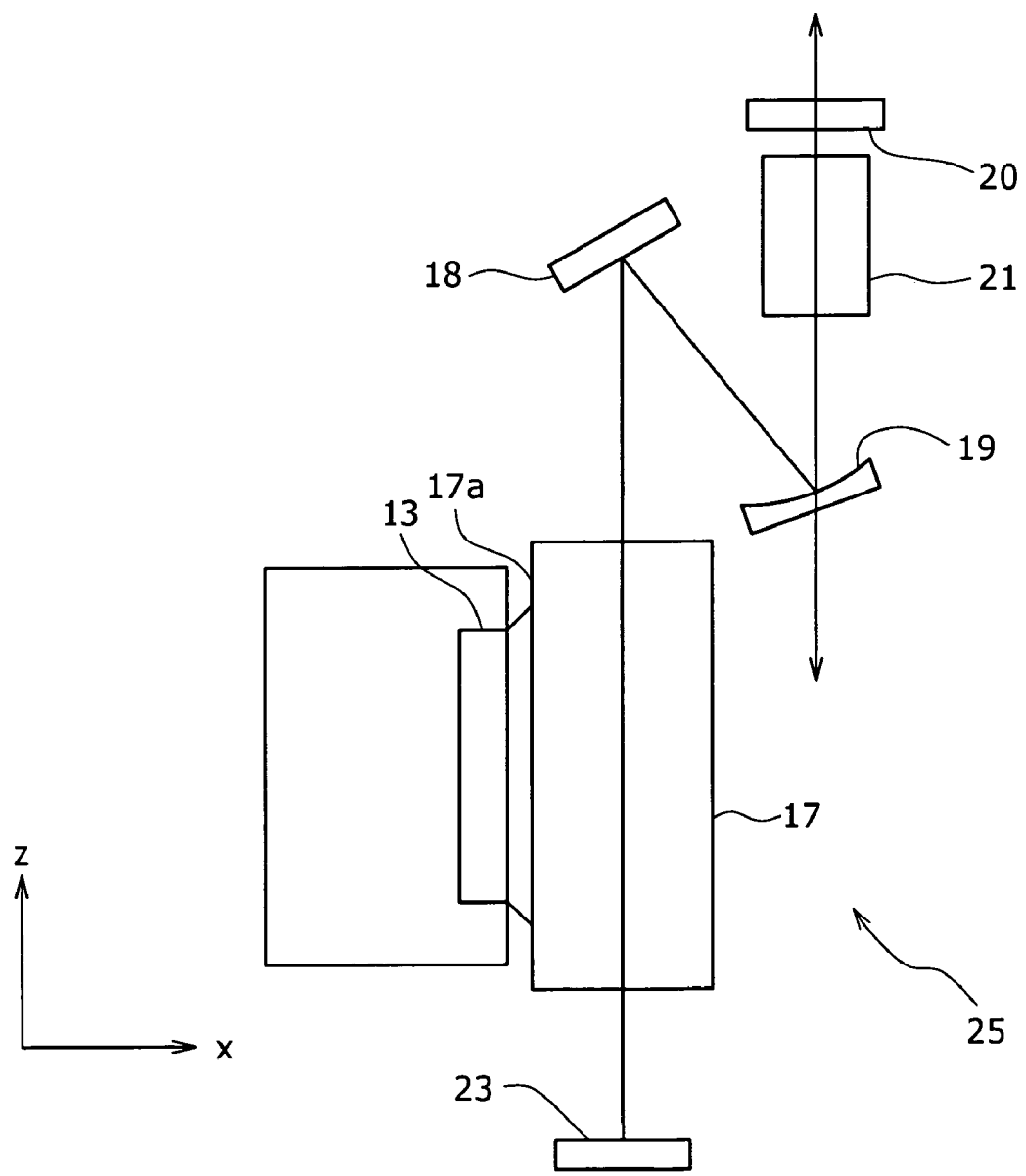
FIG. 15 is a view showing, together with FIG. 16, a form in which a laser medium is directly irradiated with light from a parallel-connected light source, as a further example of the one-dimensional illumination apparatus according to an embodiment of the present invention, showing the configuration as viewed from a direction orthogonal to the plane containing the arrangement direction of the emitters constituting the parallel-connected light source.
Figure 16:
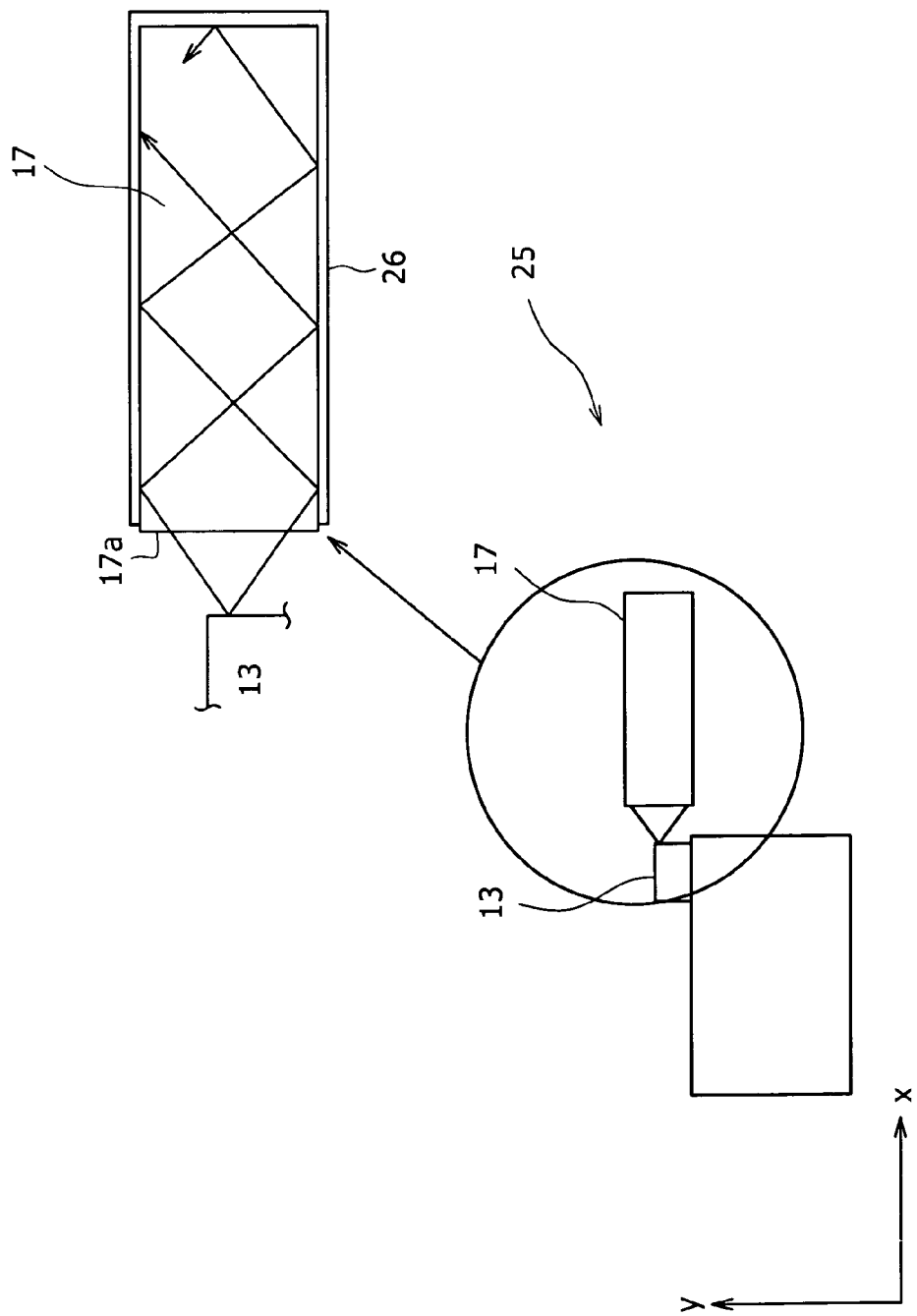
FIG. 16 is a view showing a major part of the configuration as viewed from a direction different from that of FIG. 15.

(B-3) A form in which a laser medium is directly irradiated with the pumping light from a parallel-connected light source (see FIGS. 15 and 16)

In an exemplary configuration shown in FIGS. 6 and 7, a laser medium (Nd:YAG or the like) is irradiated with pumping light by use of a semiconductor laser (bar laser) and two collimator lenses.

Incidentally, FIG. 6 shows the configuration as viewed from the y-axis direction orthogonal to the x-axis and the z-axis of a rectangular coordinate system set on the paper surface, while FIG. 7 shows the configuration as viewed from the z-axis direction orthogonal to the x-axis and the y-axis of the rectangular coordinate system set on the paper surface (in relation to the resonator, only the laser medium is shown), with the z-axis being set along the optical axis of the resonator.

This configuration is the same as the exemplary configuration shown in FIGS. 3 and 4 in that the parallel-connected light source 13 constituting the pumping light source and the collimator lenses 14, 15 are used, but differs from the above exemplary configuration in the following points:

The output axis of the laser medium 17 is set in the z-axis direction (major axis direction), the pumping light from the parallel-connected light source 13 is converted into a parallel form by the collimator lenses 14, 15, and the laser medium 17 is irradiated with the parallel-formed pumping light from the x-axis direction.

The mirrors 18 and 23 disposed on the z-axis are located on the opposite sides, with the laser medium 17 therebetween.

In this embodiment, the longitudinal direction (major axis direction) of the laser medium 17 composed of a slab-like crystal is set as the laser oscillation direction, and the outgoing light from the parallel-connected light source 13 is transmitted through the collimator lenses 14, 15 to irradiate therewith a side surface (one of side surfaces orthogonal to the x-axis) 17a of the laser medium 17. Specifically, the output rays from the emitters of LDs constituting the parallel-connected light source 13 are condensed in the x-y plane in FIG. 7 by the collimator lens 14, and are condensed in the x-z plane in FIG. 6 by the micro-lenses of the collimator lens 15. The collimated parallel rays are perpendicularly incident on the side surface 17a of the laser medium 17.

Figure 17:
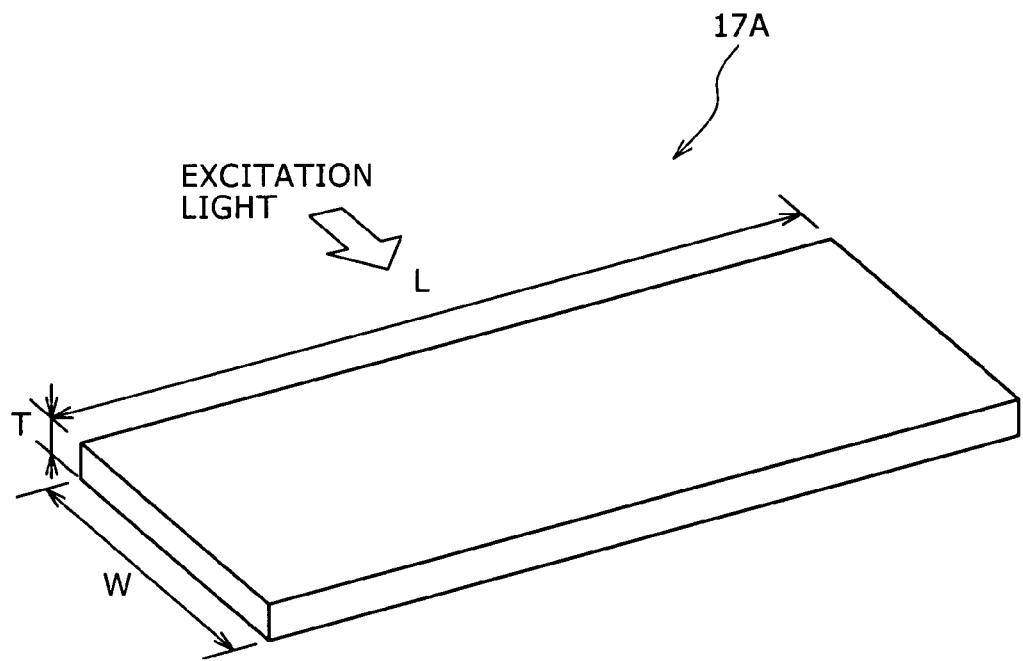
FIG. 17 is a perspective view showing an exemplary shape of a solid state laser medium.
Figure 18:
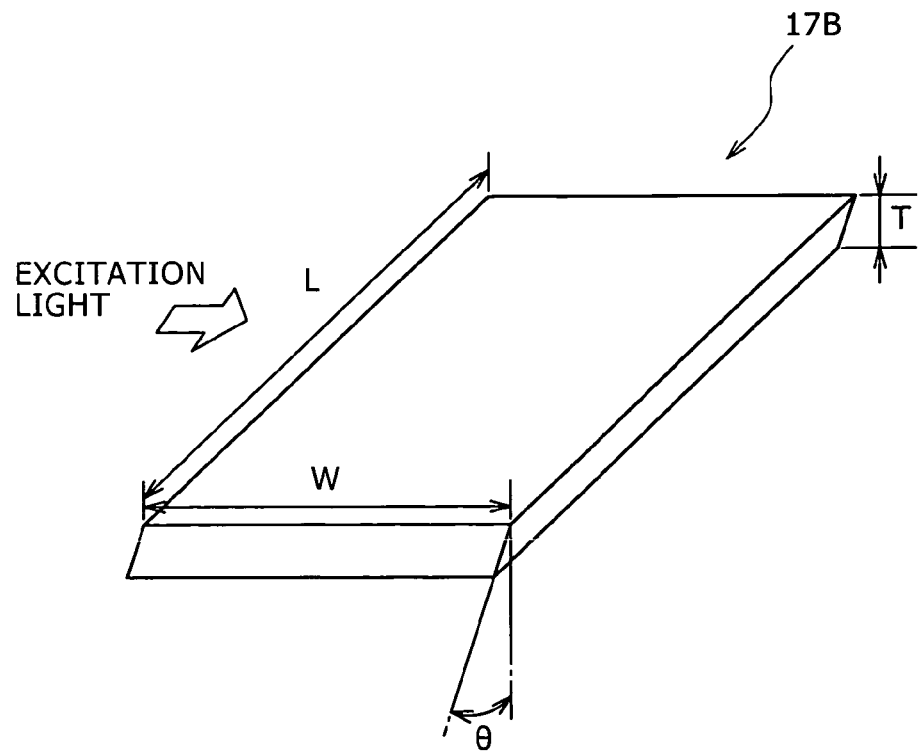
FIG. 18 is a perspective view showing another exemplary shape of the solid state laser medium.

Examples of the shape of the solid state laser medium in the case of using, for example, Nd:YAG, namely, yttrium-aluminum-garnet ($Y_3Al_5O_{12}$) doped with neodymium ions, include a plate-like shape shown in FIG. 17. In this embodiment, the end face in the major axis direction (oscillation direction) of the solid state laser medium 17A is so configured that the normal thereto is in the major axis direction (the end face is orthogonal to the major axis direction). On the other hand, in an example shown in FIG. 18, the end face in the major axis direction of the solid state laser medium 17B is inclined at angle "θ" against the plane orthogonal to the major axis, i.e., it is so processed as to have a Brewster's angle with respect to the oscillation light.

As for the size of the solid state laser, for example, the thickness "T" is not more than 1 mm, the length "L" in the major axis direction is about 10 to 20 mm, and the transverse width "W" is about 4 to 6 mm.

In the case where the laser medium is roughly rectangular parallelopiped in shape, the processing is easy. Besides, the shape of transverse mode pattern can be controlled by a rectangular shape design in which the lengths in three orthogonal axes are used as shape parameters. Application of the present invention is not limited to the laser medium having a rectangular section, and laser media having a circular, elliptical or other sectional shape can naturally be used.

Nonlinear optical crystal (or a nonlinear optical device) 21 for wavelength conversion by SHG or the like is provided in a resonator configured by use of reflection sections (18, 19, 20, 23) shown in FIG. 6, and one of laser oscillation rays outgoing from both end faces in the major axis direction (z-axis direction) of the laser medium 17 reaches the mirror 23, to be reflected, whereas the other is outputted toward the mirror 18.

The light going along the z-axis direction and reaching the mirror 18 is reflected by the mirror 18, whereby the optical path is changed to go toward the mirror 19. Then, the reflected light from the mirror 19 is transmitted through the nonlinear optical crystal 21 and reaches the mirror 20, to be reflected.

In the case of an SHG device using nonlinear optical crystal, the mirrors 18, 19, 20 are set to exhibit a high reflectance for the output light (fundamental light) wavelength of the laser medium 17 and a high transmittance to the second harmonic wavelength. Then, rays pertaining to an effective output and a backward output (utilized as a monitor ray for controlling the output of the pumping light source) outgo from the mirrors 19 and 20 in opposite directions. Besides, the mirror 23 is set to exhibit a high reflectance for the output light (fundamental light) wavelength of the laser medium 17.

In an exemplary configuration 24 shown in FIGS. 8 and 9, a laser medium is irradiated with pumping light by use of a semiconductor laser (bar laser) and one collimator lens, and this differs from the exemplary configuration 22 in the following point.

The outgoing light from a parallel-connected light source 13 is transmitted through the collimator lens 14 to irradiate the laser medium 17 therewith.

FIG. 8 shows the configuration as viewed from the y-axis direction orthogonal to the x-axis and the z-axis of a rectangular coordinate system set on the paper surface, and FIG. 9 shows the configuration (in relation to the resonator, only the laser medium is shown) as viewed from the z-axis direction orthogonal to the x-axis and the y-axis of a rectangular coordinate system set on the paper surface, with the z-axis being set to go along the optical axis of the resonator.

In this example, since the collimator lens 15 is not used, collimation is performed only in the x-y plane.

Incidentally, the configuration of the resonator and the like are the same as in the case of the exemplary configuration 22 above.

An exemplary configuration 24A shown in FIGS. 10 and 11 differs from the above exemplary configuration 22 in that a laser medium is irradiated with pumping light by use of a semiconductor laser (bar laser) and one condensing optical system. The outgoing light from a parallel-connected light source 13 is condensed through the condensing optical system 14A, before irradiating the laser medium 17 therewith.

FIG. 10 shows the configuration as viewed from the y-axis direction orthogonal to the x-axis and the z-axis of a rectangular coordinate system set on the paper surface, and FIG. 11 shows the configuration (in relation to the resonator, only the laser medium is shown) as viewed from the z-axis direction orthogonal to the x-axis and the y-axis of a rectangular coordinate system set on the paper surface, with the z-axis being set along the optical axis of the resonator.

In this example, the condensing optical system 14A is configured by use of one condenser lens, and the pumping light is condensed in the x-y plane by the action of the condenser lens. As the condenser lens, there can be used, for example, a cylinder lens (or cylindrical lens) with a focal distance of about 1 mm and a numerical aperture NA of more than 0.5. In this case, a beam width of about 1 mm is obtained through the cylinder lens. Here, when the condenser lens and the laser medium 17 (Nd:YAG or the like) are so arranged that the distance therebetween is about 10 mm and the focus position is located on a pumping light outgoing end face in the x-axis direction of the laser medium 17, namely, on an end face located on the opposite side of the pumping light incidence end, as indicated by point "F" in FIG. 11, the beam width can be set to be about 250 μm at the pumping light incidence end of the laser medium and about 50 μm at the pumping outgoing end. This beam width is equal to the beam width of 250 μm in the y-direction of the laser medium.

Figure 12A:
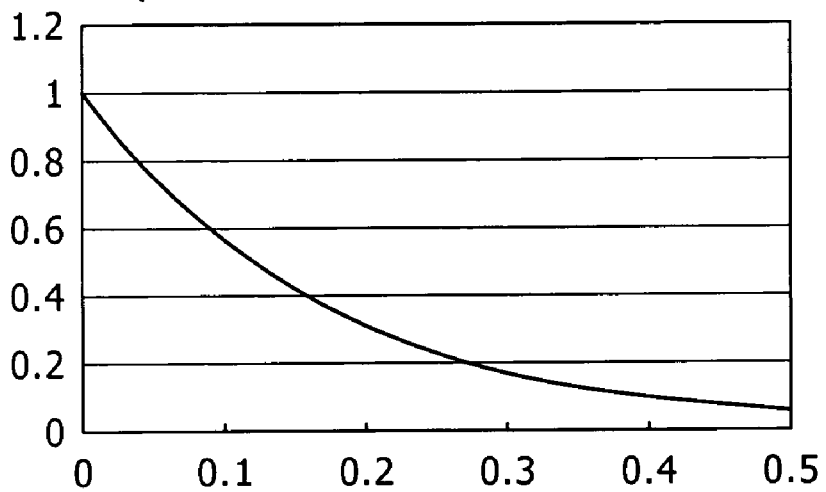
FIGS. 12A and 12B are graphs exemplifying the pumping light distribution in a laser medium.
Figure 12B:
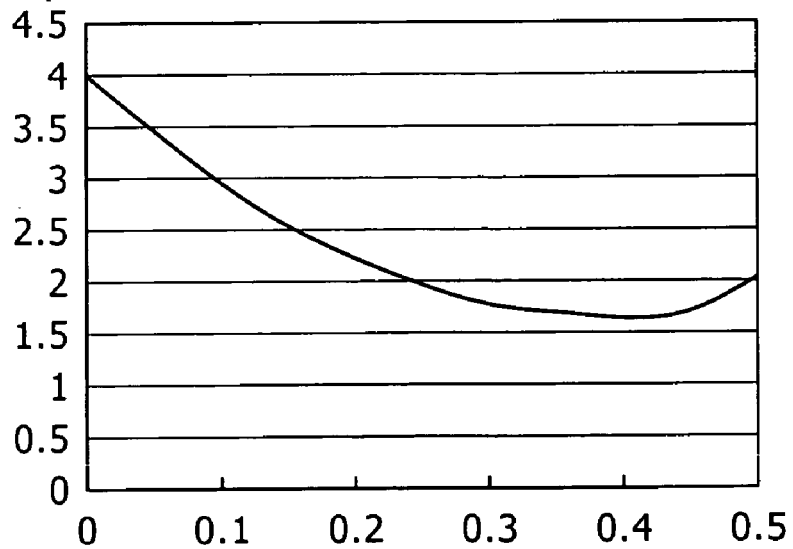

FIGS. 12A and 12B exemplify the pumping distribution in the laser medium, in which the absorption distribution in the x-y plane is exemplified, with the position in the x-axis direction taken on the axis of abscissas (in arbitrary unit by setting "0" at the position of the pumping light incidence end and "0.5" at the end position on the opposite side of the pumping light incidence end) and with the light amount taken on the axis of ordinates (in arbitrary unit). Incidentally, FIG. 12A shows the case of the above-mentioned form (B-2-1), i.e., the case of performing collimation, while FIG. 12B shows the case of the above-mentioned form (B-2-2), i.e., the case of the condensing system.

In the form (B-2-1), for example, for obtaining a beam width of 250 μm by collimation, there may be needed a lens with a short focal distance of 250 μm which is difficult to adjust in practical use. Further, in the case of using an Nd:YAG crystal with lat1230484 addition, the absorption coefficient (α) is "α=5 cm$^{-1}$" for 808 nm pumping light, and the absorption distribution is given as "exp(−α·x)" by use of exponential function.

For an Nd:YAG crystal with a width of 5 mm, the non-uniformity in the direction of the axis of abscissas with respect to the absorption distribution is large, as shown in FIG. 12A. In this example, a large difference of about "10:1" is generated between the incidence end and the opposite side end. Therefore, there may be the problems of deterioration of oscillation efficiency or non-uniformity of oscillation distribution attendant on the non-uniformity of pumping density, and a solution may be needed for the problem that thermal distortion due to pumping is concentrated at the incidence end.

In view of the above, in the form (B-2-2), it is desirable that the pumping light from the pumping light source for transverse pumping of the laser medium 17 is condensed by the condensing optical system 14A, and the focus position is disposed on or in the vicinity of an end face on the opposite side of the pumping light incidence end face of the laser medium.

For example, in the case where a beam width of about 1 mm is obtained by use of a cylinder lens, with the distance between the lens and the laser medium 17 being set to about 10 mm so that the focus position is set on the end face on the opposite side of the pumping light incidence end for incidence on the side surface of the laser medium, as shown in FIG. 11, the beam width can be about 250 µm at the pumping light incidence end and about 50 µm at the pumping light outgoing end. Therefore, in the case of an Nd:YAG crystal with an absorption coefficient of "$\alpha=5$ cm$^{-1}$" and a width of 5 mm, the non-uniformity as to absorption distribution can be largely improved, as shown in FIG. 12B. In this example, with respect to the absorption distribution at the incidence end and the opposite side end of the laser medium, the ration between the values at both ends is about "2:1".

In short, when the focus position in the condensing optical system is located on the opposite side of the pumping light incidence end face of the laser medium, the absorption distribution at the incidence end is enhanced but the spot size is enlarged relatively. Besides, as the focus position approaches the end face on the opposite side of the pumping light incidence end, the absorption distribution is lowered but the spot size is reduced relatively. Therefore, it is possible to make the pumping light density uniform in the transverse direction. According to this form, it is possible to realize pumping which is uniform in one-dimensional line oscillation and high in efficiency. By irradiating nonlinear optical crystal or the nonlinear optical device with the line beam, it is possible to output a uniform and favorable line beam.

In the configuration of using Nd:YAG or the like as the laser medium, it is preferable that the transverse width is set to be not less than 3 mm (too small a width worsens the absorption efficiency), the focal distance of the condenser lens is set to be about 1 mm (preferably, not less than 0.9 mm), and the size of the condensed light spot at the pumping light outgoing end of the laser medium is set to be not more than ½ of the size at the pumping light incidence end (for example, set to be about 100 µm). In relation to the uniformity of pumping light density, it is desirable that the relative ratio in the light density between the incidence end and the opposite side end is about 3:1, preferably about 2:1 as above-mentioned.

It may be contemplated to adopt a form in which a mirror, a reflection membrane or the like is provided at the pumping light outgoing end of the side surface of the laser medium. However, in consideration of the problem of return light to the laser diode (pumping light source) and the risk of inducing parasite oscillation in the laser medium, it is preferable to adopt a configuration in which a mirror or the like is not provided at the pumping light outgoing end.

FIGS. 13 and 14 exemplify a specific configuration corresponding to the above form (B-2).

In an exemplary configuration 24B of (B-2-1) shown in FIG. 13, the laser light outputted from a parallel-connected light source 13 is transmitted through a collimator lens 14, and is then reflected by a reflector (IR reflector) "RF", before irradiating a laser medium 17 (Nd:YAG) therewith from a side surface.

A resonator is configured by use of a mirror (plane mirror) 23, a concave mirror 18A and a mirror (plane mirror) 19A, and the laser medium 17 is disposed on the optical path between the mirror 23 and the concave mirror 18A which are arranged at an interval therebetween of 80 mm. In addition, on the optical path between the concave mirror 18A and the mirror 19A, a nonlinear optical device (for example, PPSLT, which will be described later) 21 is disposed at a predetermined distance (26 mm). Incidentally, the mirror 23 and the concave mirror 18A are designed to exhibit a high reflectance for the fundamental wave, while the mirror 19A is designed to exhibit a high reflectance for the fundamental wave and the harmonic waves.

The fundamental wave outputted from the laser medium 17 is incident on the concave mirror 18A having a radius of curvature of 50 mm at an incidence angle of 10°, and the reflected light is transmitted through the nonlinear optical device 21, to be reflected by the mirror 19A.

The harmonic waves generated at the nonlinear optical device 21 are transmitted through the concave mirror 18A, and are made parallel by a collimator lens (f30 mm) "CL" located at a predetermined distance (5.1 mm) from the concave mirror 18A, before being outputted.

The exemplary configuration 24C shown in FIG. 14 represents an application example of (B-2-2), in which the laser light outputted from a parallel-connected light source 13 is transmitted through a condenser lens 14A, to irradiate a laser medium 17 (Nd:YAG) therewith from a side surface. Specifically, the pumping light from the parallel-connected light source 13 is condensed by a cylinder condenser lens, and the focus position is set on an end face on the opposite side of an incidence end face of the laser medium 17, in the same manner as in FIG. 11.

Incidentally, the configuration of a resonator is the same as in FIG. 13.

In an exemplary configuration 25 of the above-mentioned form (B-3) shown in FIGS. 15 and 16, only a semiconductor laser (bar laser) is used, and a laser medium is located close to the laser so as to irradiate the laser medium with pumping light, without using a collimator lens or a condenser lens.

FIG. 15 shows the configuration as viewed from the y-axis direction orthogonal to the x-axis and the z-axis of a rectangular coordinate system set on the paper surface, and FIG. 16 shows the configuration as viewed from the z-axis direction orthogonal to the x-axis and the y-axis of a rectangular coordinate system set on the paper surface, with the z-axis being set along the optical axis of the resonator. (In FIG. 16, not a whole but a part of the resonator, the laser medium 17 is shown.)

In this example, the laser medium 17 is directly excited by use of a parallel-connected light source 13, so that no lens device is required therebetween, and the number of component parts is reduced accordingly. In addition, no optical alignment is needed, which is effective for reducing the number of manufacturing steps.

It should be noted here that where the light radiating from the parallel-connected light source 13 onto the laser medium 17 is incident on the laser medium 17 with a comparatively large divergence angle in the x-y plane, leakage of the light to the exterior by transmission through the laser medium 17 would cause a lowering in efficiency.

In view of this, it is preferable to provide a light confining section for the laser medium 17. Examples of the light confining section include the following forms.

A form in which total reflection is utilized

A form in which a reflection membrane is formed

A form in which a reflection member or the like is provided additionally

For example, in a form in which angle setting, polishing or the like is applied to the laser medium 17 so that the incident light undergoes total reflection in the inside of the laser medium 17, an additional mechanism such as a reflection member is not required. In addition, in a form in which a reflection membrane is formed on the outside surface (exclusive of the end face orthogonal to the z-axis) of the laser medium 17 or in a form in which a reflection member is provided, the light incident on the laser medium 17 can be efficiently confined through reflection on the reflection membrane or the reflection member.

In an example of which a circular-framed part is enlargedly shown at a right upper portion of FIG. 16, confinement of pumping light in the inside of a laser medium 17 is conducted by use of a reflection section (a metallic film, a metal-made mirror or the like) 26, whereby light absorption at high efficiency is realized, and laser efficiency can be enhanced. Incidentally, the configuration of a resonator and the like are the same as in the case of the above-mentioned exemplary configuration 22.

In the order of the above forms (B-1), (B-2) and (B-3), the number of collimator lenses is reduced by one at a time, and the configuration is simplified accordingly; however, a light confining mechanism is required in (B-3).

As has been above-mentioned, the form (B) ensures a simple configuration and permits the use of an LD array, which is suitable for enhancing the output. Besides, since the pumping light can be dispersed, heat removal (measure for radiation of heat from the laser medium) is easier to achieve than in the form (A), and the form (B) is advantageous for enhancement of stability, elongation of useful life, and the like. Further, in the case of the one-dimensional multiple mode oscillation, an efficiency comparable to that of the end pump can be obtained by a contrivance in the pumping method.

In the form in which collimation by a lens array is conducted as in the above form (B-1), a high-efficiency side pump can be realized through pumping with parallel rays. When the oscillation mode size and the size of the pumping light coincide with each other, high-efficiency oscillation similar to that in the case of the end pump can be achieved with one-dimensional transverse mode oscillation.

In addition, in the above form (B-2), for example, collimation in the x-y plane (collimation in the direction perpendicular to the junction) is conducted by using only a rod lens (collimator), whereby the oscillation mode size and the size of the pumping light can be made to coincide with each other in the longitudinal direction (z-axis direction).

In the above form (B-3), no lens is used, which is effective for a reduction in the number of component parts, a reduction in cost, and the like.

Figure 19:
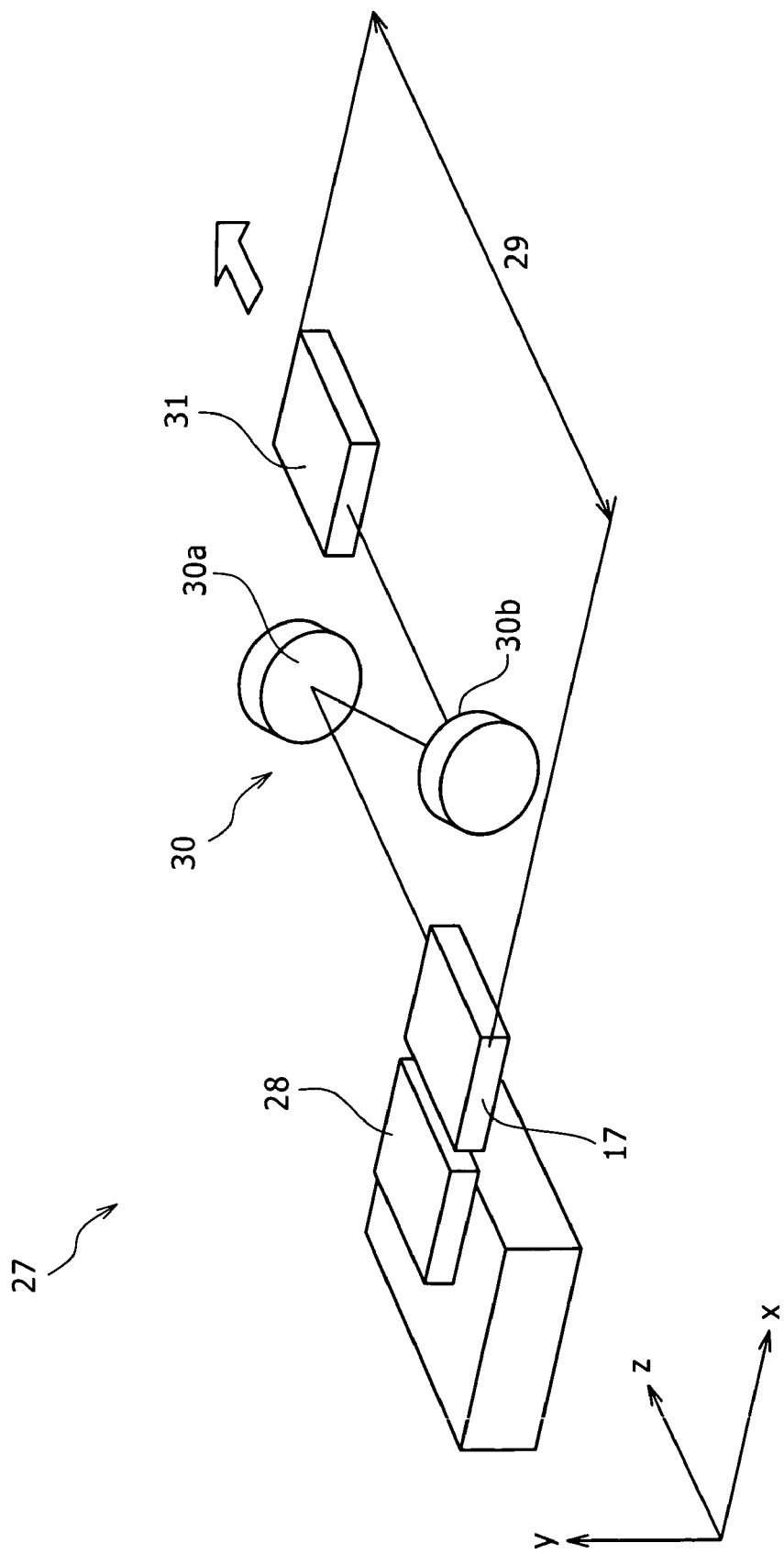
FIG. 19 is a perspective view exemplifying the configuration of the one-dimensional illumination apparatus according to an embodiment of the present invention.

FIG. 19 is a perspective view showing generally an exemplary configuration 27 pertaining to the form (B-3).

In a three-dimensional rectangular coordinate system set in the figure, the axis extending in the direction of the laser output axis of the laser medium 17 having a rectangular parallelopiped shape is set as z-axis, the axis along the direction of irradiation of a side surface of the laser medium 17 with the pumping light is set as x-axis, and the axis orthogonal to the z-axis and the x-axis is set as y-axis.

Light pumping in the laser medium 17 (Nd:YAG, YVO or the like) in a resonator 29 is conducted by the side irradiation light coming from a light source 28 configured by use of a laser diode array, then the light oscillated by the laser is turned back by a reflection section 30 (a plane mirror 30a and a concave mirror 30b), and a nonlinear optical device 31 is irradiated with the line beam.

In this example, in the light propagation direction, one end face of the laser medium 17 or the nonlinear optical device 31 is set as a reflection surface, so that the number of component parts of the resonator 29 is four.

With the line beam transmitted through the nonlinear optical device 31, a line output beam having undergone wavelength conversion is obtained. As the nonlinear optical device 31, for example, an optical device having a periodical poling structure is preferably used. This optical device ensures that the nonlinear optical constant is greater than that of conventional nonlinear optical crystal, a high conversion efficiency can be obtained, and the optical device can be mass-produced by a wafer process technology, which is advantageous for lowering the cost. When stoichiometric composition periodical poling lithium tantalate (PPSLT) having been subjected to vapor transport equilibration (VTE) is used as the periodical poling material in application to the nonlinear optical device (SHG device or the like) having the periodical poling material, an optical device resistant to optical damage, excellent in long-term reliability, and high in conversion efficiency is obtained; therefore, high output light (SHG light or the like) of not less than several watts can be obtained stably. Besides, with the transverse multiple mode direction made to coincide with the transverse multiple mode direction of a slab laser, power scaling in the transverse direction can be achieved (a power in excess of 10 W may be obtained).

Now, an optical device produced by processing a substrate subjected to vapor transport equilibration (VTE) by use of a strong dielectric material will be described below, taking stoichiometric composition periodical poling lithium tantalate ($LiTaO_3$) as an example.

FIGS. 20A to 20E are schematic diagrams for illustrating the outline of a production process, and the optical device is produced through the following steps, for example.

(1) Feeding of wafer
(2) VTE
(3) Single poling
(4) Pattering (formation of electrodes and the like)
(5) Periodical poling (poling by application of voltage)
(6) Cutting, polishing, and coating First, a substrate (crystal substrate) 32 is fed into the apparatus, and settings are conducted. For example, in FIG. 20A, an about 102 mm (4 in) full wafer is used.

In the VTE step, for example, a platinum dish or the like charged with raw material powders is placed in an alumina vessel, the substrate is disposed over the raw material powders, then the surroundings of the raw material powder and the substrate are covered with a platinum crucible, they are contained in an alumina vessel, and heating at a high temperature is conducted for a predetermined time.

Figure 20A:
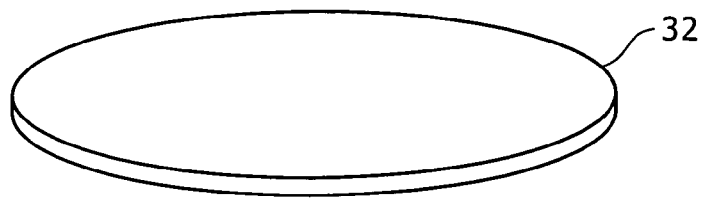
FIGS. 20A to 20E are general illustrations of a process for producing a nonlinear optical device.
Figure 20B:
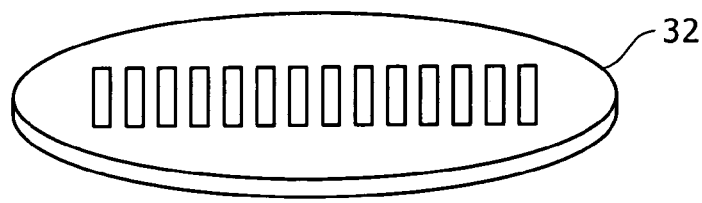
Figure 20C:
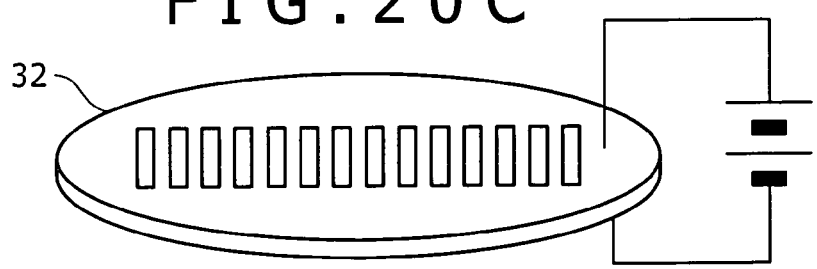
Figure 20D:
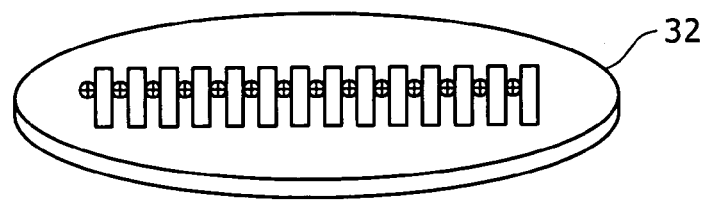

Then, the substrate 32 having undergone the high temperature treatment by VTE is taken out, single poling is conducted by applying a predetermined voltage at a predetermined temperature. As shown in FIG. 20B, electrodes (aluminum electrodes or the like) at a predetermined period (several micrometers) are formed in the patterning step by lithography. In a periodical poling structure, for example, a comb-shaped electrode or a grating-shaped electrode or the like coinciding with a poling period pattern in the strong dielectric substrate is formed. As shown in FIG. 20C, an external DC voltage at several hundreds of volts is impressed between paired electrodes (a pair of electrodes on the face and back sides, or the like). As a result, a domain structure having a required poling period is realized, as conceptually shown in FIG. 20D.

Figure 20E:
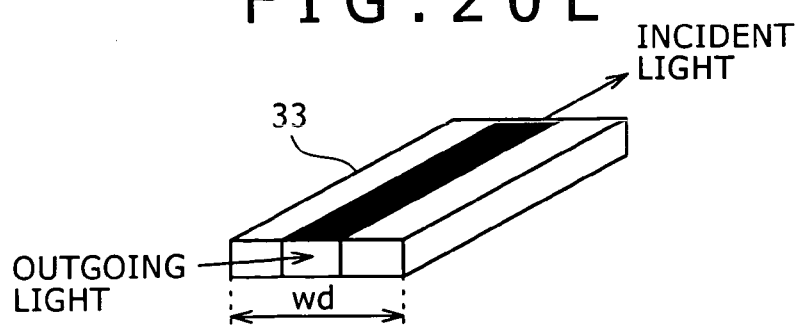

Thereafter, the individual device portions formed on the substrate through such treatment steps as polishing are separated, to complete the optical devices 33 as shown in FIG. 20E (for example, SHG devices of several millimeters in length in the ray propagation direction).

The thickness of the substrate using the periodical poling material is from about 0.5 to about 1 mm. Although a certain limit is present as to the thickness because too thick a substrate leads to a long VTE treatment time, there is no limitation as to the substrate width (the width in the direction orthogonal to the ray propagation direction and the thickness direction. See "wd" in FIG. 20E), and the transverse width can be made sufficiently large. This means that, in the resonator shown in FIG. 19, it is possible to dispose a nonlinear optical device with a sufficient width in the x-axis direction, relative to the line beam outputted from the laser medium 17. In relation to the limit as to the crystal light density (light output per unit area), the transverse width of the substrate can be made sufficiently large, so that it is possible to easily coped with the beam expansion in the width direction, which is preferable for enhancing the output (where a certain limitation is exerted on the substrate thickness of the optical device in the one-dimensional transverse multiple mode pertaining to a solid state laser crystal, enlargement of the substrate in the width direction is effective).

Where a green or blue line beam is outputted by an SHG using such a nonlinear optical device, a rare earth-added solid state laser medium (17) is placed in an IR resonator (29), in FIG. 19. A nonlinear optical device (31) in the IR resonator is irradiated with high-output IR output rays from the solid state laser medium, whereby a visible ray can be obtained through SHG. For example, owing to the oscillation wavelength of rare earth, oscillated light for producing a light color (green or blue) can be obtained. Where the IR wavelength is 1064 nm or 914 nm, the wavelength of the SHG light is 532 nm or 457 nm, respectively.

Examples of the configuration of the solid state laser resonator inclusive of the nonlinear optical device include the following forms.

Figure 21:
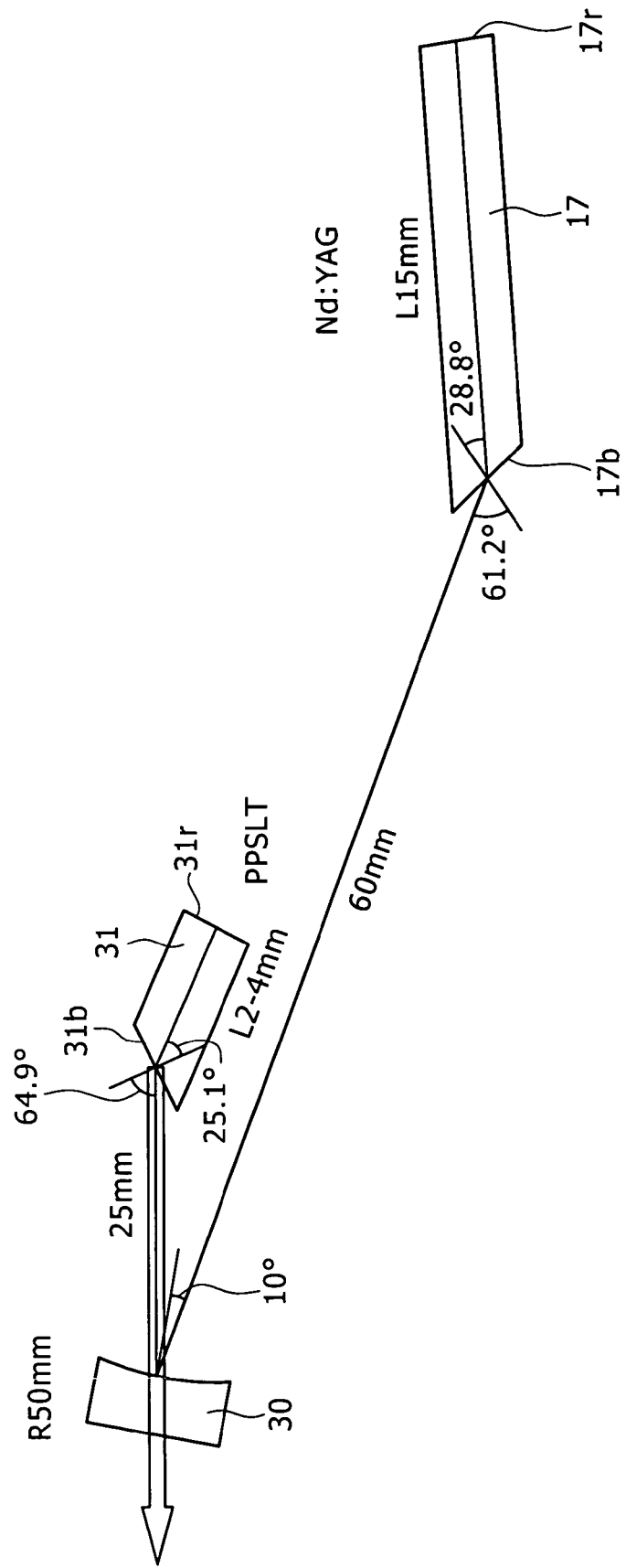
FIG. 21 is a side view showing an exemplary design of a resonator according to an embodiment of the present invention.

(I) A form in which a reflection surface is formed on one end face of the linear optical device (II) A form in which a reflector is disposed at a predetermined distance from the nonlinear optical device FIG. 21 is a side view showing an exemplary design (side surface pumping system) of the resonator pertaining to the form (I), in which Nd:YAG (15 mm in length) is used as the laser medium 17, and PPSLT (2 to 4 mm in length) is used as the nonlinear optical device 31, whereby SHG light (532 nm) is outputted from the fundamental wave (1064 nm).

Of the end faces 17b and 17r of the Nd:YAG, one 17b is made to be an inclined surface so processed as to have a Brewster's angle (61.2°) in relation to the fundamental wave, and the other 17r is a reflective surface coated with HR which exhibits a high reflectance for the fundamental wave.

The outgoing light from the Nd:YAG reaches a reflection section 30 (a concave mirror with a radius of curvature of 50 mm) with an optical length of 60 mm, is reflected (reflection angle: 10°), and is incident on the PPSLT with an optical length of 25 mm.

Of the end faces 31b and 31r of the PPSLT, one 31b is made to be an inclined surface so processed as to have a roughly Brewster's angle (64.9°) in relation to the fundamental wave and the second harmonic wave, and the other 31r is a reflective surface coated with HR which exhibits a high reflectance for the fundamental wave and the harmonic waves. The harmonic waves from the PPSLT are outputted after transmission through the reflection section 30 (output mirror), and are condensed by a collimator lens (not shown).

In an SHG device formed by use of a periodical poling material, SHG light can be efficiently obtained at the time of phase matching of the nonlinear optical constant d33 ("d33" indicates the z-axis direction).

In this instance, the polarization directions of the incident fundamental wave light and the SHG light are in the z direction of the crystal axes (the direction perpendicular to the wafer).

In the case of the same polarization, when polishing is so conducted as to provide the crystal end face with a Brewster's angle, both the incident fundamental wave light and the SHG light can be taken out without any loss, which eliminates the need for AR coating. However, for the Brewster processing in the z-direction (the direction perpendicular to the wafer), in the case of bulk phase matching, a conventional thin wafer (1 mm or below) needs processing of about 65° (in the case of PPSLT) in the wafer thickness direction, and it has been difficult to obtain a practically effective aperture.

In CLT (congruent composition lithium tantalate) and CLN (congruent composition lithium niobate), the poling voltage is high, and it is difficult to achieve bulk poling for generating visible rays where the wafer thickness is 1 mm or more; in PPSLT, on the other hand, a resistance electric field of about 100 V/mm is obtained, so that it is possible to achieve poling for a wafer thickness of 1 mm or more. With this level of thickness, it is possible to secure a sufficient aperture even for beams with a spot size of 100 μm. Experiments have verified that favorable Brewster polishing can be performed on wafers of 0.9 mm or more in thickness. In this instance, a Brewster's angle difference of 3.5° is generated between the fundamental wave of 1064 nm and the second harmonic wave of 532 nm; however, the reflection loss at 532 nm is as small as 0.7% or below, so that the two waves can be taken out with little loss.

Now, the above-mentioned form (II) will be described below, referring to FIG. 22. This figure is a side view showing only a major part (a nonlinear optical device 31 and a reflector 34) of a resonator.

Of the nonlinear optical device 31 (PPSLT) having a length "L1" and disposed in the resonator, an end face is polished so as to have roughly a Brewster's angle for the incidence angle and the outgoing angle of the fundamental light (q1=64.8°).

In the PPSLT, SHG outputs are generated in both of the directions indicated in the figure as "SHG1" (rightward direction) and "SHG2" (leftward direction).

In this instance, the SHG outputs each have a short wavelength of one half of the fundamental oscillated light wavelength (1064 nm), so that the refractive index is large, and an offset angle (indicated as "dq") is generated as to the traveling direction of the fundamental oscillated light. In fact, the refractive index of the PPSLT is n1=2.133 at 1064 nm and n2=2.141 at 532 nm, so that an offset of dq=3.5° is generated by the Snell's law (the reflection loss in this case is as little as below 0.7%).

The reflector 34 is a high-reflection mirror capable of reflecting almost 100% of light at the two wavelengths of 1064 nm and 532 nm.

The output light indicated as "SHG1" is reflected by the reflector 34 with an angular offset of "−dq", and the angle of "−dq" is preserved even upon re-transmission through the PPSLT, so that the light travels leftwards in the figure, with the angle of "−dq". On the other hand, for the output light indicated as SHG2, an angular offset of "+dq" is generated.

Eventually, the beams are generated without superposition, in the directions "+dq" and "−dq", i.e., with an angular difference of "2·dq". Therefore, no interference would be generated between the beams, and it is possible to obtain stable SHG outputs which are not influenced by a phase difference due to the reflector or the crystal.

Thus, of the harmonic wave beams in the two directions generated by d33 phase matching, the harmonic beam indicated as SHG1 outgoes from the nonlinear optical device 31, is reflected by the reflector 34, is again incident on the nonlinear optical device 31, and outgoes through an end face on the opposite side of the device. On the other hand, the harmonic beam indicated as SHG2 outgoes through an end face located on the opposite side of the reflector 34. When the angular difference is provided between both the harmonic beams so that they are not superposed on each other, the need for phase control is eliminated. In other words, at the fundamental light wavelength of 1064 nm and the SHG light wavelength of 532 nm, the angular difference due to the wavelength difference is generated between the Brewster's angle end faces of the PPSLT, so that two separate beams are obtained at the reflector 34; in this instance, it is important that the two beams are not superposed on each other (where the beams are superposed on each other, phase control is needed, as known, leading to complication of the configuration or the control).

In illumination of the above-mentioned one-dimensional light modulation device, by setting the one-dimensional direction (major axis direction) of the modulation device and the transverse multiple mode direction to coincide with each other, it is possible to unnecessitate the profile conversion by a line generator or the like. In a conventional configuration, conversion of a Gaussian beam as solid state laser beam into a top-hat shape (profile conversion) has been needed; on the other hand, according to the above-mentioned configuration, profile conversion is unnecessary, so that the number of component parts can be reduced.

Since there is no need for a special optical system for profile conversion, for example, a configuration common for the colors can be used for the beam expanding systems used in one-dimensional illumination of the diffraction grating type one-dimensional spatial modulation device (grating light valve device or the like). The use of beam expanders having different configurations for the R, G and B color beams would cause complication of configuration and the like. Therefore, it is preferable to use the beam expanders of the same configuration for the colors. According to the above-mentioned configuration, the same optical configuration as that for the red beam is used for each of the green and blue beams, and the one-dimensional optical device can be irradiated with the beams while expanding the line beams in a predetermined ratio (for example, ten to tens of folds, where the beam length is several millimeters and the effective length in the longitudinal direction of the modulation device is several tens of millimeters). For example, a conventional optical system using four plano-convex lenses and one cylindrical lens may be adopted, and each line beam is once condensed in the plane containing the major axis direction and the optical axis direction of the one-dimensional light modulation device, before being expanded and shaped in the major axis direction (the cylindrical lens at the final stage does not have power in the plane but has a condensing action in only the plane containing the minor axis direction and the optical axis direction of the one-dimensional light modulation device).

Where application to an image projector or the like having an illumination system for a diffraction grating type one-dimensional spatial modulation device using a one-dimensional transverse multiple mode laser light source is assumed, in relation to the illumination light for the device, the demand for spatial coherence of condensing characteristics is not severe in the one-dimensional direction (the major axis direction of the modulation device) but is high in the direction orthogonal to the one-dimensional direction (i.e., in the minor axis direction of the modulation device) for the purpose of condensing the beam to a predetermined width (several tens of micrometers). In order to meet the demand, the illumination optical system with the above-mentioned configuration is adopted, whereby it is possible to obtain a beam expanded in the one-dimensional direction by light pumping in transverse multiple mode in the major axis direction (longitudinal direction) of the modulation device, and to irradiate the one-dimensional light modulation device with a line beam condensed substantially to the diffraction limit in the minor axis direction of the modulation device.

Now, the proper range of coherence length will be described below.

The coherence length (Lc) in multiple mode is represented by "Lc=2·L/N", where "N" is the number of modes, and "L" is the length of the resonator.

Therefore, when the resonator length "L" is set small and the number of modes "N" is set large, the coherence length will be small. For example, where the resonator length is about 150 mm and the N value exceeds 50, the coherence length is about 5 mm.

The mode interval "Δλ" is given by the following formula, where "L" is the resonator length, and "λ" is wavelength.

$$\Delta\lambda = \frac{\lambda^2}{2\cdot L} \quad \text{[Formula 1]}$$

In the case where the resonator length is L=150 mm, at the oscillation wavelength of Nd:YAG of 1064 nm, Δλ≈3.8 pm (picometers). Since the oscillation spectrum width at 1064 nm is about 0.5 nm, oscillation can be performed at about 130 modes, so that the condition of "(the number of modes)>50" (the necessary condition for the uniformity of illumination light profile not to be spoiled under the influence of interference arising from speckles) is apparently fulfilled.

Incidentally, the number of possible modes, N, is represented by the following formula:

$$N = \frac{\Delta\lambda_{YAG}}{\Delta\lambda} = \frac{\Delta\lambda_{YAG}\cdot 2\cdot L}{\lambda^2} \quad \text{[Formula 2]}$$

where "$\Delta\lambda_{YAG}$" is the oscillation spectrum width at 1064 nm.

Entering this formula into "Lc=2·L/N" gives the following formula.

$$Lc = \frac{2\cdot L}{N} = \frac{\lambda^2}{\Delta\lambda_{YAG}} \quad \text{[Formula 3]}$$

From "$\Delta\lambda_{YAG}$≈0.5 nm" and "λ=1064 nm", there is obtained Lc≈2.2 mm, which gives the lower limit of the coherence length.

In application of the present invention, it is preferable on a practical use basis that the coherence length is not less than 2 mm and not more than 20 mm (a coherence length outside the range is attended by evil influences such as an enlargement in size of the optical system). Particularly, in the case of using Nd:YAG as the laser medium, it is desirable to set the coherence length in the range of 2.2 mm to 15 mm. The range is effective for illuminating the one-dimensional spatial modulation device without causing a lowering in condensing performance and for sufficiently reducing speckle noises, by use of a transverse multiple mode solid state laser.

Figure 23A:
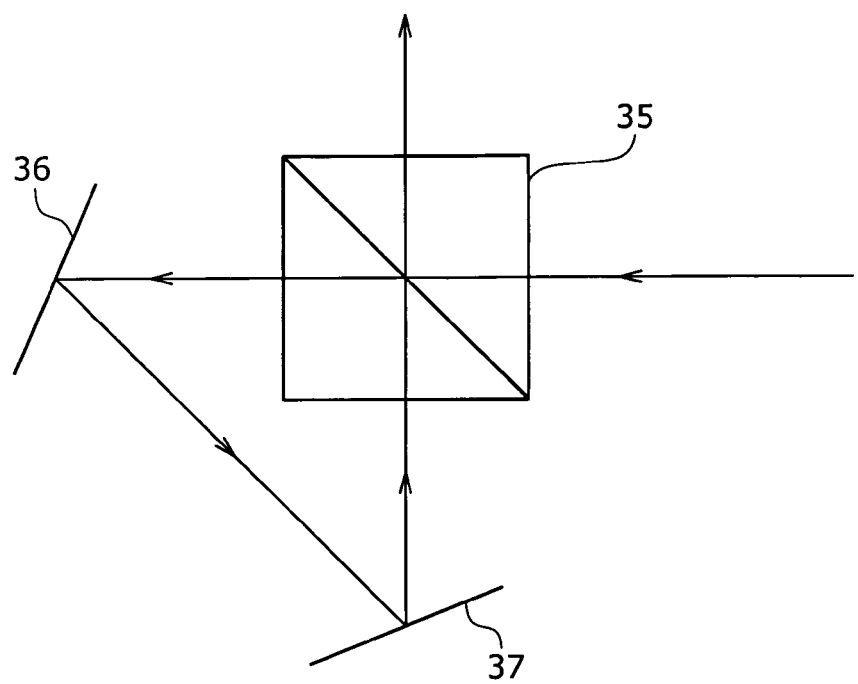
FIGS. 23A and 23B are illustrations of a speckle reducing optical system.
Figure 23B:
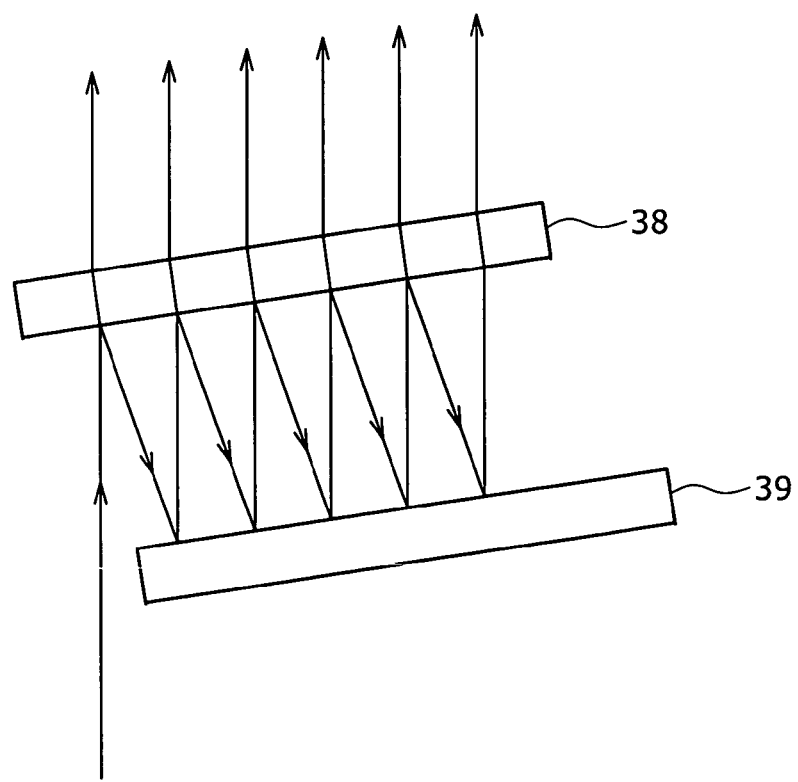

FIGS. 23A and 23B exemplify optical systems effective for reducing speckles, in which FIG. 23A shows the configuration based on composing of polarized rays, and FIG. 23B shows a multipass configuration.

In FIG. 23A, an example using a PBS (polarized light beam splitter) 35 and two mirrors 36, 37, in which when multiple mode laser light with the polarization plane inclined at 45° is incident on the PBS 35 from the right side, the S wave is reflected upwards, whereas the P wave is transmitted through the PBS 35 and is then reflected by the mirrors 36 and 37. The reflected light from the mirror 37 is transmitted through the PBS 35, to be outputted upwards.

In this example, the composing of the two polarized beams is utilized, whereby speckle contrast can be reduced to $1/(\sqrt{2})$ times the original value.

FIG. 23B shows an example in which a half-mirror 38 and a high-reflection mirror 39 are used as parallel flat plate-like devices. The multiple mode laser light coming from the lower side is branched by the mirror 38, and a plurality of rays are outputted. The plurality of rays are condensed by a lens (not shown).

In the case where N rays are transmitted through the half-mirror 38, the speckle contrast can be reduced to $1/(\sqrt{N})$ times the original value.

By setting the coherence length to be not more than 10 mm, for example, it is possible to shorten the optical path length in the optical system, which is effective for reducing the size of the apparatus and for integrating the optical component parts (for example, putting the PBS 35 and the mirrors 36, 37 into an integral structure). On an experimental basis, a coherence length of 7.4 mm has been obtained as the result of measurement on a scanning type TG interferometer with respect to the transverse multiple mode laser.

Generally, a method of spatially superposing the beams by use of a one-dimensional integrator is used for enhancing the uniformity as to the intensity distribution of the one-dimensional illumination light. In this case, the lowness of coherence due to the transverse multiple mode acts effectively. Naturally, the one-dimensional integrator can be unnecessitated according to an embodiment of the present invention.

In addition, adoption of a multi-beam configuration (or beam stack configuration) in which a plurality of beams are arranged in a one-dimensional or two-dimensional pattern by use of a plurality of the illumination optical system is effective for a reduction of speckle noises, and the like.

According to the above-described configurations, the following merits can be obtained.

The light pumping in an elliptic transverse mode pattern makes it possible to achieve illumination at high efficiency, which is effective for reducing speckle noises.

By disposing the condensing optical system between the pumping light source and the laser medium and setting the focus position on the end face on the opposite side of the pumping light incidence end for incidence on the side surface of the laser medium, it is possible to improve uniformity of pumping light density and oscillation efficiency, to moderate the thermal strain due to pumping, and to obtain a higher output.

Efficiency can be enhanced by LD end face pumping.

Output can be enhanced by LD end face pumping.

The number of component parts and the number of production steps can be reduced in the case of adopting direct pumping of the laser medium by an LD array.

The use of a rectangular solid state laser beam facilitate processing.

Confinement of pumping light in the laser medium makes it possible to enhance laser efficiency.

In the case of adopting the nonlinear optical device having a periodical poling structure, it is possible to obtain a high conversion efficiency, and to mass-produce the optical device, which is effective for reducing the cost.

In the case of PPSLT based on VTE, a high resistance to optical damage is obtained, the long-term reliability is excellent, the conversion efficiency is high, so that a high output can be obtained stably. By selecting the position of periodical poling for the one-dimensional transverse multiple mode direction to thereby expand the beam in the transverse direction, the power can be enhanced beyond the limit of light density of a periodical poling material.

By disposing a turning-back mirror in the resonator, it is possible to contrive a smaller size and to reduce stray light of the SHG light.

The need for conversion of a Gaussian beam into a top-hat shape (profile conversion) as in the related art is eliminated, so that an intensity distribution in the top-hat shape can be obtained in the one-dimensional transverse multiple mode.

By use of a rare earth-added solid state laser medium, it is possible to obtain IR rays at high output, and to obtain oscillated rays for forming green and blue rays (SHG light).

It is possible to realize the characteristics necessary for illumination of a one-dimensional light modulation device (a beam exhibiting transverse multiple mode in the one-dimensional direction and being roughly at the diffraction limit in the direction orthogonal to the longitudinal direction), to achieve efficient illumination with a simple optical system, and to reduce speckle noises.

It should be understood by those skilled in the art that various modifications, combinations, sub-combinations and alterations may occur depending on design requirements and other factors insofar as they are within the scope of the appended claims or the equivalents thereof.

What is claimed is:

1. An transverse multiple mode laser comprising:
a pumping light source; and
a resonator including a laser medium and a wavelength conversion device,
a nonlinear optical crystal or a nonlinear optical device which constitutes said wavelength conversion device being irradiated by a line beam obtained by exciting said laser medium in an elliptical transverse mode pattern to thereby obtain a one-dimensional output light line ray; and wherein
said nonlinear optical device has a periodical poling structure, and
both end faces of said nonlinear optical device have been processed to have roughly a Brewster's angle with respect to the incidence angle and emission angle of fundamental light, a reflector is provided at a position spaced from said nonlinear optical device;
harmonic rays are generated in two directions having d33 phase matching, one harmonic ray is reflected by said reflector after outgoing from said nonlinear optical device and emits from an end face on an opposite side of said nonlinear optical device after being again incident on said nonlinear optical device, whereas the other harmonic ray emits from an end face of said nonlinear optical device located on the opposite side of said reflector, and an angular difference is provided between said harmonic rays so that said harmonic rays are not superimposed on each other.

2. The one-dimensional illumination apparatus as set forth in claim 1, wherein
pumping light emitted from said pumping light source for transverse pumping of said laser medium is condensed by a condensing optical system, and the focus position is set on or in the vicinity of an end face on the opposite side of an end face through which said pumping light is incident on a side surface of said laser medium.

3. The one-dimensional illumination apparatus as set forth in claim 1, wherein a semiconductor laser is used as said pumping light source, and an end portion in the direction along a laser output axis of said laser medium is irradiated with pumping light.

4. The one-dimensional illumination apparatus as set forth in claim 1, wherein a semiconductor laser is used as said pumping light source, and said laser medium is irradiated with pumping light from a lateral side orthogonal to a laser output axis.

5. The one-dimensional illumination apparatus as set forth in claim 3, wherein said apparatus uses a parallel-connected light source obtained by arranging a plurality of laser emitters in a one-dimensional pattern, and a lens array disposed between said parallel-connected light source and said laser medium.

6. The one-dimensional illumination apparatus as set forth in claim 4, wherein said apparatus uses a parallel-connected light source obtained by arranging a plurality of laser emitters in a one-dimensional pattern, and a lens array disposed between said parallel-connected light source and said laser medium.

7. The one-dimensional illumination apparatus as set forth in claim 4, wherein said laser medium is directly excited by use of a parallel-connected light source obtained by arranging a plurality of Laser emitters in a one-dimensional pattern.

8. The one-dimensional illumination apparatus as set forth in claim 7, wherein the section of said laser medium is rectangular.

9. The one-dimensional illumination apparatus as set forth in claim 7, wherein said laser medium is provided with a light confining means.

10. The one-dimensional illumination apparatus as set forth in claim 1, wherein a plurality of reflection means for turning back of optical path are disposed between said laser medium and said nonlinear optical crystal or a nonlinear optical device.

11. The one-dimensional illumination apparatus as set forth in claim 1, wherein a green or blue line beam is outputted by second harmonic generation using said nonlinear optical crystal or a nonlinear optical device.

12. The one-dimensional illumination apparatus as set forth in claim 11, wherein a rare earth added solid stage laser medium is disposed in an IR resonator.

13. The one-dimensional illumination apparatus as set forth in claim 1, wherein the coherence length is not less than 2 mm and not more than 20 mm.

14. The one-dimensional illumination apparatus as set forth in claim 13, wherein neodymium ion-doped yttrium-aluminum-garnet is used as said laser medium, and said coherence length is not less than 2.2 mm and not more than 15 mm.

15. The one-dimensional illumination apparatus as set forth in claim 1, wherein the resistance electric field of a substrate used for said nonlinear optical device is 100 V/mm, the thickness of said substrate is not less than 0.9 mm, and the poling period is not more than 10 μm for phase matching as to harmonic generation.

* * * * *